(12) United States Patent
Hobara

(10) Patent No.: US 8,120,018 B2
(45) Date of Patent: Feb. 21, 2012

(54) SEMICONDUCTOR DEVICE COMPRISING SEMICONDUCTOR MOLECULES AND A CONDUCTOR FORMED OF FINE PARTICLES AND LINKER MOLECULES

(75) Inventor: Daisuke Hobara, Kanagawa (JP)

(73) Assignee: Sony Corporation (JP)

( * ) Notice: Subject to any disclaimer, the term of this patent is extended or adjusted under 35 U.S.C. 154(b) by 497 days.

(21) Appl. No.: 12/023,975

(22) Filed: Jan. 31, 2008

(65) Prior Publication Data

US 2008/0191202 A1    Aug. 14, 2008

(30) Foreign Application Priority Data

Feb. 8, 2007 (JP) .............................. P2007-028679

(51) Int. Cl.
*H01L 51/10* (2006.01)
*H01L 51/30* (2006.01)

(52) U.S. Cl. ........... 257/40; 257/E51.023; 257/E51.027; 257/E51.028; 257/E51.029

(58) Field of Classification Search .................... 257/40, 257/E29.068, E29.069, E29.07, E29.071, 257/E51.005, E51.006, E51.01, E51.011, 257/613, 798, E51.001–E51.004, E51.023–E51.025, 257/E51.027–E51.052

See application file for complete search history.

(56) References Cited

U.S. PATENT DOCUMENTS

2005/0056828 A1 *  3/2005  Wada et al. ..................... 257/40

OTHER PUBLICATIONS

"Coulomb blockade and the Kondo effect in single-atom transistors", Nature, 417, 722-725 (2002).
"Single-electron transistor of a single organic molecule with access to several redox states", Nature, 425, 698-701 (2003).
"Electron transport through a metal-molecule-metal junction", Phys. Rev. B, 59, 12505-12513 (1999).
"Comparison of Electron Transport Measurement on Organic Molecules", Adv. Mater., 15, 1881-1890 (2003).
"Single electron transistor using a molecularly linked gold colloidal particle chain", J. Appl. Phys., 82, 696-701 (1997).
"The Dynamics of Noble Metal Atom Penetration through Methoxy-Terminated Alkanethiolate Monolayers", J. Am. Chem. Soc., 126, 3954-3963 (2004).

* cited by examiner

*Primary Examiner* — Lynne Gurley
*Assistant Examiner* — Andrew O. Arena
(74) *Attorney, Agent, or Firm* — K&L Gates LLP

(57) ABSTRACT

A semiconductor device is disclosed. The device includes: oppositely disposed plural electrodes; a semiconductor molecule disposed such that one end part thereof binds to a surface of the electrode in each of the opposing electrodes; and a conductor for electrically connecting at least a part of the other end part of the semiconductor molecule disposed in one electrode of the opposing electrodes to at least a part of the other end part of the semiconductor molecule disposed in the other electrode of the opposing electrodes. The conductivity between the opposing electrodes is substantially determined by the conductivity of the semiconductor molecule electrically connected to the conductor between the opposing electrodes in the semiconductor molecules.

14 Claims, 17 Drawing Sheets

↓ ADSORPTION OF ORGANIC SEMICONDUCTOR MOLECULE 5

↓ DISPOSITION OF FINE PARTICLE 6

↓ INTRODUCTION OF LINKER MOLECULE 7

↓ ADSORPTION OF ORGANIC SEMICONDUCTOR MOLECULE 5

↓ DISPOSITION OF FINE PARTICLE 6

↓ INTRODUCTION OF LINKER MOLECULE 7

↓ ○ LIGAND MOLECULE 51

↓ • METAL ION 31e

↓ × LIGAND MOLECULE

< LIGAND MOLECULE 51 AND REACTION MOLECULE 61 >

< LIGAND MOLECULE 52 AND REACTION MOLECULE 62 >

(FIG. 10 CONTINUED)
(REACTION 1)
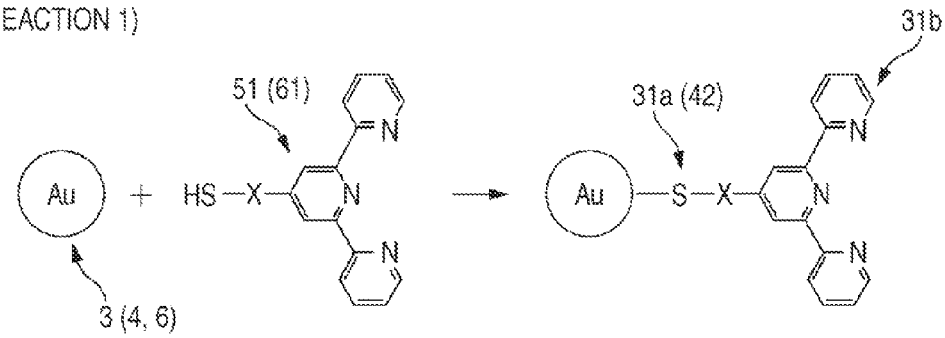
(REACTION 2)
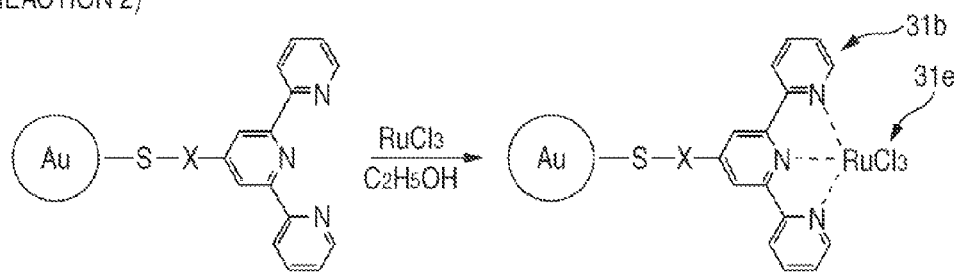
(REACTION 3)
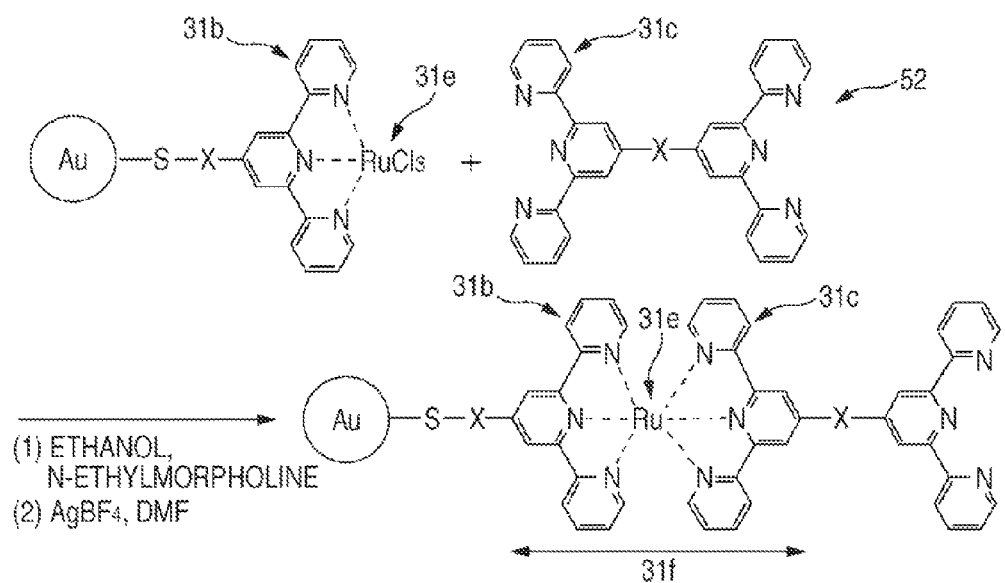

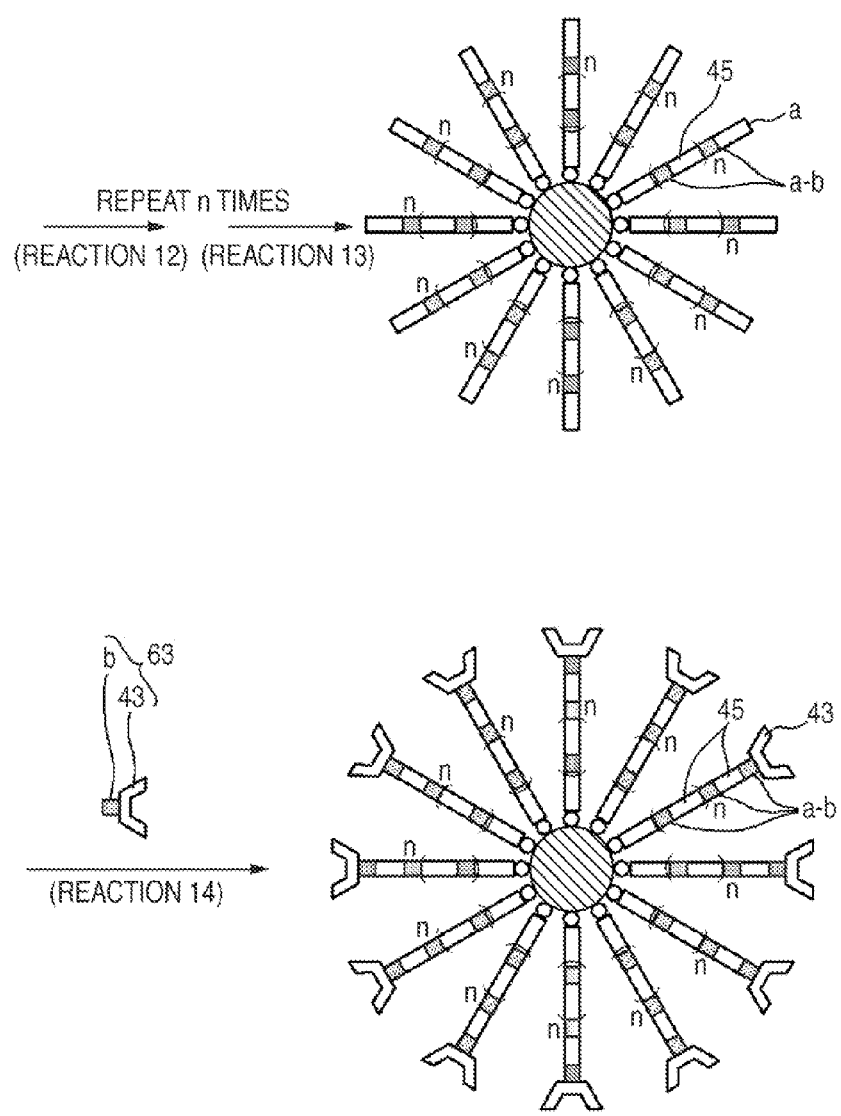

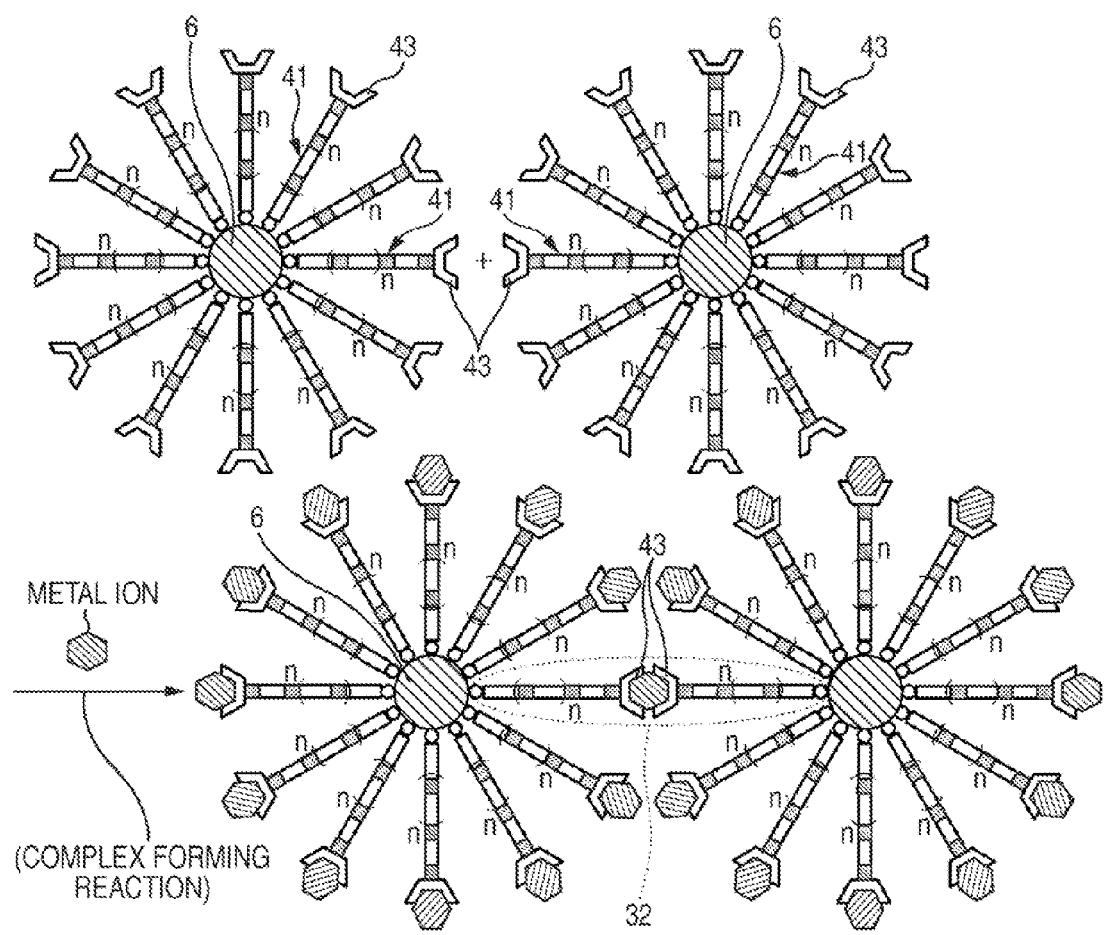

SEMICONDUCTOR DEVICE COMPRISING SEMICONDUCTOR MOLECULES AND A CONDUCTOR FORMED OF FINE PARTICLES AND LINKER MOLECULES

CROSS REFERENCES TO RELATED APPLICATIONS

The present application claims priority to Japanese Patent Application JP 2007-028679 filed in the Japan Patent Office on Feb. 8, 2007, the entire contents of which being incorporated herein by reference.

BACKGROUND

The present application relates to a semiconductor device using a semiconductor molecule as a channel material and to method for manufacturing the same. More specifically, the present application relates to a semiconductor device which has a channel region with excellent electric conductivity and which is easy for the preparation and to a method for manufacturing the same.

Organic semiconductor devices of the related art, for example, organic transistors have a structure represented by of an electrode/molecular aggregate/electrode figure, dispose an organic semiconductor molecule material in a form of a molecular crystal, a coagulated molecular aggregate or the like between the two electrodes and form a channel layer between the electrodes. In such case, plural molecules intervene in a passage of a current flowing from the one-sided electrode to the other electrode, and the electric conduction in the channel layer includes an intramolecular charge transfer process wherein a charge transfers within a molecule and an intermolecular charge transfer process wherein a charge transfers between molecules from one molecule to a next molecule. In general, the mobility between molecules is much smaller than that within a molecule. As a result, the mobility of the channel layer configured by the molecular aggregate is restricted by the intermolecular charge transfer process and is small.

On the other hand, in the nanotechnology which is a technique for observing, preparing and utilizing a fine structure with a size of about 10 nm ($=10^{-8}$ m), studies for making an individual molecule exhibit a function as an electronic part such as single molecular transistors attract attention.

Such a molecular device has a structure represented by of an electrode/molecule/electrode figure, and the semiconductor molecule interposed between the two electrodes is connected to each of the two electrodes at both ends thereof. Since the electric conduction between electrodes in such a molecular device including a monomolecular device is dominated by the intramolecular charge transfer process but not subjected to rate-determining by the intermolecular charge transfer process, rapid electric conduction becomes possible.

FIG. 14A is a diagrammatic view showing a structure of a molecular transistor 100 as described in J. Park, A. N. Pasupathy, J. I. Goldsmith, C. Chang, Y. Yaish, J. R. Petta, M. Rinkoski, J. P. Sethna, H. D. Abruna, P. L. McEuen, D. C. Ralph, *Nature*, 417, 722 (2002) (Non-Patent Document 1); and FIG. 14B is a structural formula showing a structure of a semiconductor molecule. As illustrated in FIG. 14A, this molecular transistor 100 is configured as an insulating gate type field effect transistor of a bottom-gate type. A substrate 101 also acts a gate electrode and is, for example, a silicon substrate having n-type conductivity by doping with n-type impurities. A gate insulating film 102 composed of silicon oxide is formed on the surface of the substrate 101 by means of thermal oxidation of the substrate 101; and a source electrode 103 and a drain electrode 104 each of which is composed of gold are provided opposite each other thereon. A semiconductor molecule 105 is disposed so as connect the source electrode 103 and the drain electrode 104 each other on the gate insulating film 102.

As illustrated in FIG. 14B, the semiconductor molecule 105 is a cobalt(III) complex containing two terpyridyl groups as a ligand and has a thiol group (—SH) which is easily adsorbed on gold or the like via an alkylene chain (—$(CH_2)_n$—) at both ends thereof The semiconductor molecule 105 is bound to the source electrode 103 and the drain electrode 104, respectively by this thiol group. Though a distance between the two thiol groups in the semiconductor molecule 105 varies a little with the length of the alkylene chain (—$(CH_2)_n$—), it is from about 2 to 3 nm.

In the molecular transistor 100, a current flowing between the source electrode 103 and the drain electrode 104 by means of intramolecular conduction of the semiconductor molecule 105 is modulated by a gate voltage to be applied to the gate electrode and functions as an insulating gate type field effect transistor. As easily surmised from FIG. 14A, in order that the semiconductor molecule 105 may form good junction to the electrodes 103 and 104, respectively by the thiol group present at the both ends thereof and act as a molecular device with high reliability, it is important that opposing electrodes having a gap part of substantially the same size as the length of the semiconductor molecule 105 are formed with good reproducibility.

Non-Patent Document 1 describes that the molecular transistor 100 was prepared by integrally forming the source electrode 103 and the drain electrode 104 connected each other via a thin stripe-like connecting part by means of patterning by electron beam lithography, adsorbing the semiconductor molecule 105 on this surface and then cutting the connecting part by means of electromigration, thereby separating it into the source electrode 103 and the drain electrode 104, respectively.

Also, S. Kubatkin, A. Danilov, M. Hjort, J. Cornil, J. Bredas, N. Stuhr-Hansen, P. Hedegard, T. Bjornholm, *Nature*, 425, 698 (2003) (Non-Patent Document 2) describes an example in which a monomolecular transistor having the same structure as in the molecular transistor 100 is prepared by using a phenylene vinylene oligomer having a thiol group at both ends thereof as a semiconductor molecule. In that case, an example in which opposing electrodes having a gap part of from 2 to 3 nm are formed by means of "oblique vapor deposition" using a shadow mask is reported. In all of Non-Patent Documents 1 and 2, the transistor operation utilizes coulomb brocade, and its measurement is carried out at a very low temperature.

As described in the foregoing examples, in many cases, the natural length of the semiconductor molecule to be used in the molecular device is several nm at longest. Therefore, the molecular device having a structure represented by an electrode/molecule/electrode figure and utilizing intramolecular conduction has no choice but to have a structure in which a semiconductor molecule having a length of several nm is disposed between opposing electrodes having a gap part of several nm and connected to the respective electrodes at the both ends thereof.

As to a method for manufacturing such a molecular device, various methods have been proposed until now. Such a manufacturing method can be roughly classified into a method in which opposing electrodes having a gap part of several nm are first prepared, and a semiconductor molecule is then disposed in the gap part (method 1) (see C. Kergueris, K. P. Bourgoin, S. Palacin, D. Esteve, C. Urbina, M. Magoga, and C. Joachim, *Phys. Rev. B*, 59, 12505-12513 (1999) (Non-Patent Document 3)); and a method in which one of electrodes is first prepared, a semiconductor molecule is then disposed thereon, and thereafter, the other electrode is prepared (method 2) (see Adi Salomon, David Cahen, Stuart Lindsay, John Tomfohr, Vincent B. Engelkes, and C. Daniel Frisbie, *Adv. Mater.*, 15, 1881-1890 (2003) (Non-Patent Document 4)).

Also, (T. Sato, H. Ahmed, D. Brown, B. F. G. Johnson, *J. Appl. Phys.*, 82, 696 (1997) (Non-Patent Document 5) reports a field effect transistor connecting a source electrode and a drain electrode each other by a gold fine particle chain connected by 1,6-hexanedithiol. The structure of this transistor is slightly different from that of the foregoing molecular device represented by an electrode/molecule/electrode figure, the charge transfer between molecules is not included in a conductive route, and the mobility is not restricted by the charge transfer between molecules; and therefore, rapid electric conduction becomes possible. Also, there is an advantage that the transistor can be prepared by employing electron beam lithography in a length of a gap part between the source electrode and the drain electrode is 30 nm.

According to the method 1 as described in Non-Patent Document 3, since the semiconductor molecule is introduced in the last stage of the manufacturing process, the semiconductor molecule is not damaged. On the other hand, it is not easy to prepare two electrodes having a gap part of several nm in length with high precision and with high reproducibility, and in many cases, it is difficult to form junction of the semiconductor molecule to the electrodes as expected. For that reason, the preparation of a molecular device having high reliability with good reproducibility has not been achieved yet.

On the other hand, according to the method 2 as described in Non-Patent Document 4, since it is not necessary to previously prepare opposing electrodes having a gap part in conformity with the length of the semiconductor molecule, this method is advantageous in view of the formation of junction of the semiconductor molecule to the electrodes. But, there is a problem that in forming a second electrode on a semiconductor molecular film, the semiconductor molecular film is damaged, or an electrode material comes into a defect present in the semiconductor molecular film, thereby unexpectedly affecting characteristics of the device (see Amy V. Walker, Timothy B. Tighe, Orlando M. Cabarcos, Michael D. Reinard, Brendan C. Haynie, Sundararajan Uppili, Nicholas Winograd, and David L. Allara, *J. Am. Chem. Soc.*, 126, 3954-3963 (2004) (Non-Patent Document 6)). Accordingly, a method for forming a second electrode in which the semiconductor molecular film is less damaged is considered necessary.

Also, according to the method 2, in many cases, the molecular device is prepared by stacking up configuration components in a vertical direction so as to form a semiconductor molecular film on a first electrode and further forming a second electrode thereon. In such a device of a vertical type, a gate electrode must be disposed in a side of the semiconductor molecular film, and it is difficult to form a gate insulating film or control its thickness as compared by general devices of a horizontal type.

Also, in the field effect transistor as reported in Non-Patent Document 5, several gold fine particles having a particle size of about 10 nm are disposed between two electrodes having a gap part of about 30 nm, and connection between the electrode and the gold fine particle and connection between the gold fine particles are each achieved by 1,6-hexanedithiol. According to this method, it is possible to achieve connection between the electrodes by a repeating structure of molecule/gold fine particle/molecule/ . . . /gold fine particle/molecule without damaging the 1,6-hexanedithiol molecule. Moreover, this method is free from the problem in disposing a gate electrode as in the device of a vertical type. However, according to the method as reported in Non-Patent Document 5, since the disposition of the gold fine particle between the electrodes is left to the coincidence, it may be impossible to control how many and what places repeating structures are formed in the electrode. Also, there is a possibility that the gold fine particle adsorbed in the surroundings of the electrode unexpectedly forms a conductive route.

SUMMARY

Under these circumstances, it is desirable to provide a semiconductor device using a semiconductor molecule as a channel material, in which the conductivity of a channel region is excellent without being restricted by the intermolecular charge transfer and which can be prepared easily and surely, and a method for manufacturing the same.

An embodiment is a first semiconductor device including:
oppositely disposed plural electrodes;
a semiconductor molecule disposed such that one end part thereof binds to a surface of the electrode in each of these opposing electrodes; and
a conductor for electrically connecting at least a part of the other end part of the semiconductor molecule disposed in one electrode of the opposing electrodes to at least a part of the other end part of the semiconductor molecule disposed in the other electrode of the opposing electrodes;
wherein the conductivity between the opposing electrodes is substantially determined by the conductivity of the semiconductor molecule electrically connected to the conductor between the opposing electrodes in the semiconductor molecules.

Another embodiment is a second semiconductor device including:
oppositely disposed plural electrodes;
a semiconductor molecule disposed such that one end part thereof binds to a surface of the electrode in one electrode of the opposing electrodes; and
a conductor for electrically connecting at least a part of the other end part of the semiconductor molecule to the other electrode;
wherein the conductivity between the opposing electrodes is substantially determined by the conductivity of the semiconductor molecule electrically connected to the conductor between the opposing electrodes in the semiconductor molecules.

It is meant by the terms "substantially determined" as referred to herein that the resistance of the semiconductor molecule electrically connected to the conductor is much larger than that of the conductor by, for example, 10 times or more and that the conductivity between the opposing electrodes is substantially determined by the foregoing semiconductor molecule and does not substantially change even when the resistance of the conductor changes a little.

Another embodiment is a method for manufacturing the foregoing first and second semiconductor devices, including the steps of
forming plural opposing electrodes;
disposing a semiconductor molecule on a surface of one electrode of the opposing electrodes or surfaces of both electrodes of the opposing electrodes such that one end part thereof binds to the surface of the electrode; and forming a conductor for electrically connecting at least a part of the other end part of the semiconductor molecule disposed in one of the electrodes to at least a part of the other end part of the semiconductor molecule disposed in the other electrode, or electrically connecting at least a part of the other end part of the semiconductor molecule to the other electrode.

In accordance with the first semiconductor device of still another embodiment, the semiconductor molecule is bound to the surface of the opposing electrode in one end part thereof; in at least a part of the molecule, the other end part is electrically connected to the conductor; and this conductor is provided so as to electrically connect the opposing electrodes each other. Accordingly, when a voltage is applied between the opposing electrodes, a current goes from one of the electrodes through the semiconductor molecule binding to the one-sided electrode in the one end part thereof and binding to the conductor in the other end part thereof, comes into the conductor; passes through the conductor; goes through the semiconductor molecule binding to the conductor in the other end part thereof and binding to the other electrode in the one end part thereof, and flows into the other electrode. That is, a channel region composed of the semiconductor molecule is formed in two regions interposed between each of the opposing electrodes and the conductor.

In general, since the conductivity in a semiconductor molecule is relatively low, by adequately choosing a material and a structure of the conductor, it is possible to make the conductivity of the conductor much higher than that of the channel region. In such case, since the conductivity between the opposing electrodes is substantially determined by the conductivity of the semiconductor molecule in the channel region, the conductor can be considered as an electrode substitute for complementing the opposing electrode in a gap part between the opposing electrodes. That is, in the two regions interposed between each of the opposing electrodes and the conductor, a semiconductor device using one of the opposing electrodes and the conductor act as substantial opposing electrodes and using the semiconductor molecule as a channel material is practically effectively formed; and the first semiconductor device of the embodiment according to the present application can be considered as a semiconductor device in which these two semiconductor devices are connected in series by the conductor.

In the foregoing practically effectively formed semiconductor device, the semiconductor molecule is bound to one of the opposing electrodes, and in at least a part of the molecule, the other end part is electrically connected to the conductor. Therefore, the charge transfer in the channel region is chiefly achieved by means of intramolecular charge transfer, and the mobility and the like are not restricted by the intermolecular charge transfer with a slow mobility. Accordingly, it is believed that the first semiconductor of an embodiment is able to realize the performance equal to that in the molecular transistor as described in the above-mentioned Non-Patent Document 1 or 2.

On the other hand, with respect to the manufacture, the first semiconductor device of the embodiment is much easily prepared as compared with the molecular transistor as described in Non-Patent Document 1 or 2. As mentioned previously, the molecular transistors of the related art are required to be adjusted to have a distance between the opposing electrodes substantially the same as the length of the semiconductor molecule. In order to realize it, the processing technology of a nanometer level is necessary. On the other hand, in the first semiconductor device of the embodiment according to the present application, the distance between the opposing electrodes is from about several μm to several tens μm and is about 100 nm at a minimum. The majority of this gap part is occupied by the conductor, and a high processing precision is not required. Therefore, the first semiconductor device of the embodiment can be prepared according to the semiconductor technology of the related art. In the first semiconductor device of the embodiment, a distance between one of the opposing electrodes functioning as an opposing electrode in the practically effective semiconductor device and the conductor opposite thereto is required to have the precision of a nanometer level. As described below, in the method for manufacturing the first semiconductor device of the embodiment, it is possible to easily control this distance with precision of a nanometer level according to a self-organization method.

That is, by choosing an adequate molecule as the semiconductor molecule and exposing the opposing electrode to a solution or vapor of the semiconductor molecule, a monomolecular film composed of the semiconductor molecule is spontaneously formed on the surface of the opposing electrode due to a self-organization action of the semiconductor molecule itself. In this monomolecular film, each molecule is bound to the surface of the electrode in one end part thereof, the length direction of the molecule is made intersected with the surface of the electrode; and the molecules gather so as to come into contact with each other on the side surfaces of the molecules due to an intermolecular mutual action. As a result, the thickness of the monomolecular film is equal to the length of the molecule and substantially constant; and the other end parts of the semiconductor molecules are entirely and closely arrayed on the surface (surface on the opposite side to the electrode) (as to the example in which a semiconductor layer is formed by a monomolecular film formed in a self-organization manner, an example in which a semiconductor layer is formed on the surface of a source electrode or a drain electrode is described in, for example, K. Sasano, et al., Jpn. J. Appl. Phys., 43 (2004), L337 and G. Hwang, et al., Appl. Phys. Lett., 89 (2006), 133120; and an example in which a semiconductor layer is formed as a channel layer on the surface of a gate insulating film is described in, for example, G. S. Tulevski, et al., J. Am. Chem. Soc., 126 (2004), 15048).

Accordingly, when, for example, a metal fine particle composed of a material which is easily bound to the other end part or the like is deposited on this surface, thereby forming the conductor by this metal fine particle, a distance between the opposing electrode and the conductor opposite thereto becomes automatically equal to the length of the semiconductor molecule. As described previously, since the conductor is formed "in combination" with the already formed monomolecular film, it is possible to easily realize the precision of a nanometer level.

The second semiconductor device of an embodiment and the method for manufacturing the same are different from the first semiconductor device of the embodiment according to the application only in the points that the semiconductor molecule is provided in only one but not both of the opposing electrodes and that only one practically effective semiconductor device is formed on this side. Accordingly, the second semiconductor device of an embodiment does not substantially differ from the first semiconductor device of an embodiment has the same characteristic features.

However, actually, there may be the case where a difference between the both is important. First of all, when the manufacturing method is concerned, in the second semiconductor device, in disposing the semiconductor molecule selectively in only one of the electrodes, for the purpose of making it possible to achieve this, the other electrode must be masked, and therefore, the method becomes complicated as compared with that in the first semiconductor device. On the other hand, it is necessary to apply an optimal voltage to the both ends of the semiconductor molecule so as to obtain a field effect by the gate electrode as large as possible. In the first semiconductor device, since the semiconductor molecule is provided in both of the opposing electrodes, there may be the case where it is difficult to apply an optimal voltage to both of the semiconductor molecules while being restricted by a voltage drop to be caused due to the resistance of the conductor. Alternatively, there may be the case where the resistance of the conductor is restricted so as to make it possible to apply an optimal voltage. On the other hand, in the second semiconductor device, since the semiconductor molecule is provided in only one of the opposing electrodes, an optimal voltage can be applied to the semiconductor molecule by simply adjusting a source-drain voltage. Also, the second semiconductor device has a characteristic feature that it can be driven at a lower voltage as compared with the first semiconductor device.

Additional features and advantages are described herein, and will be apparent from, the following Detailed Description and the figures.

BRIEF DESCRIPTION OF THE FIGURES

FIGS. 13A to 13B are each an explanatory view showing connecting steps between precursor molecules according to an embodiment.

DETAILED DESCRIPTION

Figure 1A:
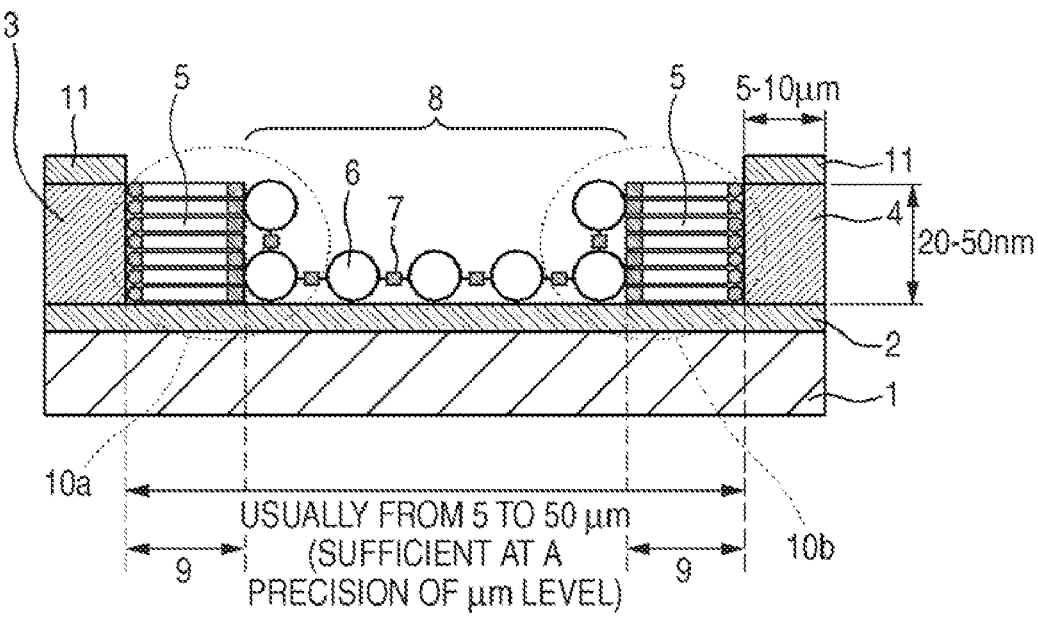
FIG. 1A is a diagrammatic cross-sectional view showing a structure of an insulating gate type field effect transistor according to an embodiment.

The present application is described below in greater detail with reference to the drawings according to an embodiment. Each of the first and second semiconductor devices of embodiments are configured as a field effect transistor such that the opposing electrodes are formed as a source electrode and a drain electrode; that a channel region is formed by the semiconductor molecule electrically connected to the conductor; and that a gate electrode for subjecting the conductivity of the channel region to electric-field control is provided. For example, the gate electrode is provided via a gate insulating film, thereby configuring a field effect transistor of a bottom-gate type or top-gate type.

Also, the conductor is formed through alternate binding between a fine particle composed of a conductor or a semiconductor and a linker molecule; and that the adjacent fine particles are connected each other by the linker molecule, thereby forming a conductive route of a network type. The conductor with high electric conductivity is thus formed.

On that occasion, the fine particle is a fine particle composed of gold (Au), silver (Ag), platinum (Pt), copper (Cu), palladium (Pd) or iron (Fe) as the conductor or silicon (Si) doped with impurities as the semiconductor and having a particle size of not more than 10 nm. When the particle size is not more than 10 nm, the connection between the fine particles by the linker molecule is surely achieved.

The linker molecule is bound to the fine particle via a functional group present at both ends thereof. It is suitable that this functional group is a thiol group (—SH), a disulfide group (—S—S—), an amino group (—NH2), a cyano group (—CN) or an isocyano group (—NC).

Also, the linker molecule is a molecule having a conjugated bond in at least a part of the molecule skeleton thereof and that the molecular skeleton contains, for example, a phenylene group, a phenylene ethynylene group or a thiophene skeleton.

Also, the molecular skeleton may contain a metal complex part. This metal complex part contains a conjugated ligand, for example, ferrocene, pyridine, bipyridine, terpyridine, phenanthroline, quinolinol or quinoline.

The linker molecule has a molecular length of not more than 5 nm such that a tunnel current efficiently flows between the fine particles. When the molecular length is sufficiently short (for example, not more than 1 nm), the tunnel current increases, whereby low resistance is revealed irrespective of whether the linker molecule is of a conjugated system. Therefore, the molecular skeleton may not contain at all a conjugated bond such as an alkylene group and a cycloalkylene group. Examples of such a linker molecule include 1,3-propanedithiol. It is thought that since in such a non-conjugated molecule, an energy gap between HOMO (highest occupied molecular orbital) and LUMO (lowest unoccupied molecular orbital) is usually large as compared with conjugated molecules, by choosing an adequate source-drain voltage, a modulation effect to be brought due to the electric field of the gate electrode is not substantially revealed. In that case, there is an advantage that the modulation effect to the semiconductor molecule is relatively emphasized. Also, the non-conjugated sites may be connected each other via, for example, an ether, a thioether, a ketone or an ester.

Also, the conductor may be formed through fusion of the fine particles each other. Examples of a method for forming the conductor in a thin film state through fusion of the fine particles each other include heating upon irradiation with light and heating by a usual method. Also, there are exemplified a method in which after chemically removing a protective film molecule deposited on the fine particle, the fine particles are spontaneously fused and a method in which the fine particles are connected each other by a plating method.

On that occasion, the fine particle is composed of gold (Au), silver (Ag), platinum (Pt), copper (Cu), palladium (Pd), aluminum (Al), iron (Fe) or an alloy thereof. When the fine particles are fused each other, since it is not required that these fine particles are connected by the linker molecule, the particle size of the fine particle is not restricted thereby. In the case where the fusion is carried out by heating, it is suitable that the fine particle is a fine particle having a particle size of not more than 100 nm. The smaller the size of the fine particle, the lower the fusion temperature is. In case of gold, when the particle size is small as about 50 nm or less, in general, it is possible to achieve the fusion at a temperature of no higher than 200° C.

Also, the semiconductor molecule is a molecule having a conjugated bond in at least a part of the molecular skeleton thereof. It is suitable that the molecular skeleton contains, for example, a phenylene group, a phenylene ethynylene group or a thiophene skeleton. Also, the molecular skeleton may contain a metal complex part. This metal complex part contains a conjugated ligand, for example, ferrocene, pyridine, bipyridine, terpyridine, phenanthroline, quinolinol or quinoline.

Also, the semiconductor molecule has an electrode binding part as the one end part and a conductor binding part as the other end part at both ends of the molecule. The electrode binding part is composed of a thiol group (—SH) (in the case where the electrode is composed of Au, Ag, Pt, Pd, Cu or Fe), a disulfide group (—S—S—) (in the case where the electrode is composed of Au, Ag, Pt, Pd, Cu or Fe), a selenol group (—SeH) (in the case where the electrode is composed of Au or Ag), a tellurol group (—TeH) (in the case where the electrode is composed of Au or Ag), an amino group (—NH2) (in the case where the electrode is composed of Au or Ag), a cyano group (—CN) (in the case where the electrode is composed of Au), a thioisocyanide group (—SCN) (in the case where the electrode is composed of Au, Ag, Pt, Pd, Cu or Fe) or an isocyano group (—NC) (in the case where the electrode is composed of Au, Ag, Pt or Pd); and that the conductor binding part is composed of a thiol group (—SH), a disulfide group (—S—S—), a selenol group (—SeH), a tellurol group (—TeH), an amino group (—NH2), a cyano group (—CN), a thioisocyanide group (—SCN) or an isocyano group (—NC).

The electrode binding part and the conductor binding part may be composed of the same functional group or may be composed of a different functional group. However, in the case where the electrode binding part and the conductor binding part are constituted of a different functional group, it is necessary to choose one having a weak binding force to the electrode as the conductor binding part as compared with the electrode binding part. For example, in the case where the electrode binding part is composed of a thiol group or a disulfide group, it is possible to choose an amino group, a cyano group, a thioisocyanide group or an isocyano group as the conductor binding part.

Also, in the case where the molecular skeleton part is bilaterally asymmetrical, and the control of the direction of the molecular skeleton part to the electrode or the conductor affects a characteristic of the device, it is possible to make the direction of the semiconductor uniform in one direction by utilizing a difference in the binding force to the electrode between the electrode binding part and the conductor binding part. In the case where not only the direction of the organic semiconductor molecule is needed, but the electrode binding part and the conductor binding part are composed of the same functional group, it is possible to control the direction by protecting one of the functional groups by a protective group and, after binding to the electrode, removing the protective group (see S. K. Pollack, et al., Langmuir, 20 (2004) 1838).

In the method for manufacturing the first and second semiconductor devices of an embodiment the conductor is formed through alternate binding between a fine particle composed of a conductor or a semiconductor and a linker molecule; and that the adjacent fine particles are connected each other by the linker molecule, thereby forming a conductive route of a network type.

As a method for forming such a conductor, after disposing the fine particle covered and protected by a protective film molecule in a position where the conductor is formed, the linker molecule is brought into contact with the fine particle to substitute the protective film molecule with the linker molecule, thereby binding the linker molecule and the fine particle each other by the functional group which the linker molecule has.

Alternatively, after disposing the fine particle having a precursor molecule bound thereto in a position where the conductor is formed, the precursor molecule bound to the fine particle is bound to other precursor molecule bound to the adjacent fine particle, thereby forming the linker molecule for connecting the fine particles each other.

As one of methods of using this precursor molecule, there is a method of using a protective film molecule for forming a protective film capable of preventing coagulation of the fine particle. On that occasion, the protective film may be formed of only the protective film molecule, or the protective film may be formed of the protective film molecule and other protective film molecule. For example, when other protective film molecule chiefly bears a protective action to the fine particle, and the foregoing protective film molecule complements the protective action to the fine particle, it is possible to choose the protective film molecule among alternatives of a wider range. Also, it is suitable that a molecule with high electric conductivity is used as the protective film molecule.

As another method of using the precursor molecule, there is a method for forming the fine particle having the precursor molecule bound thereto, including:

forming the fine particle in a state that it is covered by a protective film molecule for preventing coagulation;

making a first molecule having a functional group capable of binding to the fine particle act on the fine particle to substitute the protective film molecule, thereby binding the first molecule to the fine particle; and polymerizing the first molecule bound to the fine particle with one or more kinds of a second molecule, thereby forming the precursor molecule.

According to the method of using the precursor molecule, a step of substituting the protective film molecule of the fine particle with the linker molecule and simultaneously connecting the fine particles each other by the linker molecule is not needed, and the adjacent precursor molecules may be allowed to merely react with each other. Accordingly, there is an advantage that the formation of the conductor is easy.

According to the method of using the precursor molecule, in order to allow the precursor molecule to react with other precursor molecule, at least one kind of a reaction selected from the group consisting of a complex forming reaction, a condensation reaction, a substitution reaction, a coupling reaction, an addition reaction, a hydrogen bond forming reaction and a π-π stacking reaction can be employed.

On that occasion, it is suitable that the reaction is caused by at least one measure selected from the group consisting of heating, light irradiation, introduction of a reaction initiator or a metal ion into the system and solvent removal. In the case where a chemical reaction by light is employed, by chemically focusing a region to be irradiated with light, it is possible to allow only the fine particle present in a specified region to react. As the need arises, the unreacted fine particle can be thereafter washed away.

Also, in the method for manufacturing the first and second semiconductor devices of embodiments according to the present application, the conductor may be formed by, after disposing the fine particle covered and protected by a protective film molecule in a position where the conductor is formed, removing the protective film molecule and fusing the adjacent fine particles each other.

Embodiment 1

In Embodiment 1, a semiconductor device configured as an insulating gate type field effect transistor and a method for manufacturing the same are described.

FIG. 1A is a diagrammatic cross-sectional view showing a structure of an insulating gate type field effect transistor (FET) 10 on the basis of Embodiment 1. As illustrated in FIG. 1A, the transistor 10 is configured as FET of a bottom-gate/bottom-contact type structure.

A substrate 1 also acts as a gate electrode and is, for example, an n-type silicon substrate doped with impurities and having conductivity. A gate insulating film 2 composed of silicon oxide or the like is provided on a surface of the substrate 1; and a source electrode 3 and a drain electrode 4 each of which is composed of gold or the like are provided opposite thereon. An insulating film 11 is provided in each of the source electrode 3 and the drain electrode 4 so as to cover a top surface thereof.

Figure 1B:
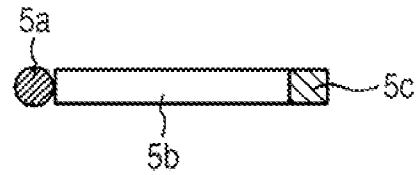
FIGS. 1B and 1C are each a diagrammatic explanatory view showing structures of a semiconductor molecule and a conductor, respectively.

A monomolecular film composed of an organic semiconductor molecule 5 is formed on a side surface of each of the source electrode 3 and the drain electrode 4. As illustrated in FIG. 1B, the organic semiconductor molecule 5 is composed of an electrode binding part 5a capable of binding to the electrode 3 or 4, a molecular skeleton part 5b and a conductor binding part 5c capable of binding a fine particle 6 as described later. In order to form the monomolecular film with good reproducibility, it is suitable that the organic semiconductor molecule 5 has a long and narrow shape and that the molecular skeleton part 5b has an adequate length.

In this monomolecular film, the respective organic semiconductor molecule 5 is bound to the side surface of the electrode by the electrode binding part 5a in one end part thereof; the length direction is made intersected with the side surface of the electrode; and the molecules gather so as to come into contact with each other on the side surfaces of the molecules due to an intermolecular force. As a result, the thickness of the monomolecular film is equal to the length of the molecule and constant; and the conductor binding parts 5c which are the other end parts of the semiconductor molecules are entirely and closely arrayed on the surface of the monomolecular film (surface on the opposite side to the electrode). As illustrated in FIG. 1A, the conductor binding part 5c is not bound to the electrode, and it is desirable that the conductor binding part 5c is aligned such that it becomes more distant from the electrode. Also, at least a part of the conductor binding part 5c is bound to the fine particle 6, and it is desirable that the conductor binding part 5c is bound to the fine particle 6 in a large amount as far as possible.

In the case where the electrode is composed of gold (Au), examples of the electrode binding part 5a capable of binding to the electrode 3 or 4 include a thiol group (—SH), a disulfide group (—S—S—), an amino group (—NH2), a cyano group (—CN) and an isocyano group (—NC). Also, in the case where the fine particle is composed of gold (Au), examples of the conductor binding part 5c capable of binding to the fine particle 6 include a thiol group (—SH), a disulfide group (—S—S—), an amino group (—NH2), a cyano group (—CN) and an isocyano group (—NC). The functional group which constitutes the electrode binding part 5a and the functional group which constitutes the conductor binding part 5c may be different from each other.

The organic semiconductor molecule 5 desirably has a conjugated system and more desirably has a conjugated system over the whole of the molecule. So far as the necessary electric conductivity is kept, the organic semiconductor molecule 5 may be an oligomer or a polymer. Examples of the molecular skeleton 5b include molecules having a phenylene group, a phenylene ethynylene group or a thiophene skeleton. The organic semiconductor molecule 5 may be a polyacene based molecule. In order that the electric field from the gate electrode 1 may effectively act on the organic semiconductor molecule 5 without being blocked by the fine particle 6, it is suitable that the molecular length of the organic semiconductor molecule 5 is long such that a distance between the electrode 3 or 4 and the fine particle 6 is large and is, for example, from 5 to 100 nm.

Figure 1C:
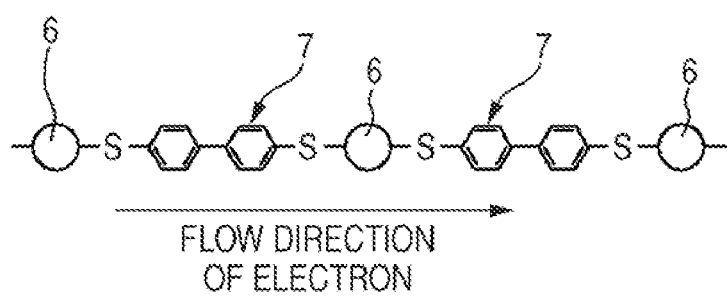

A conductor 8 is disposed between the monomolecular film of the organic semiconductor molecule 5 formed in the source electrode 3 and the monomolecular film of the organic semiconductor molecule 5 formed in the drain electrode 4. As illustrated in FIG. 1C, the conductor 8 is configured by a linker molecule 7 for connecting the fine particle 6 thereto and is bound to the conductor binding part 5c of the organic semiconductor molecule 5 by the fine particles 6 at the both ends thereof. The fine particle 6 is a fine particle having a particle size of not more than 10 nm. As a material thereof, materials having high electric conductivity, for example, conductors such as metals inclusive of gold (Au), silver (Ag), platinum (Pt), copper (Cu), palladium (Pd) and iron (Fe); and semiconductors such as doped silicon (Si) are useful.

The linker molecule 7 which connects the fine particles 6 each other has a functional group capable of binding to the fine particles 6 at the both ends thereof. In the case where the fine particle 6 is composed of gold (Au), examples of the functional group which the linker molecule 7 has at the both ends thereof include a thiol group (—SH), a disulfide group (—S—S—), an amino group (—NH2), a cyano group (—CN) and an isocyano group (—NC). The linker molecule 7 desirably has a conjugated system so as to exhibit excellent conductivity and more desirably has a conjugated system over the whole of the molecule. Examples of the linker molecule 7 include molecules having a phenylene group, a phenylene ethynylene group or a thiophene skeleton. The molecular length of the linker molecule 7 is a length sufficient for connecting the fine particles 6 each other, and for the purpose of enhancing the electric conductivity of the linker molecule 7, it is suitable that the molecular length of the linker molecule 7 is short as far as possible.

In the conductor 8, the linker molecule 7 is bound to the fine particles 6 via a functional group present at the both ends thereof, and the fine particle 6 and the linker molecule 7 are alternately connected, whereby a conductive route in which a conductive route within the fine particle 6 and a conductive route within the linker molecule 7 are connected is formed. In this conductive route, since the charge transfer within the linker molecule 7 dominantly occurs in a molecular axis direction along the principal chain thereof, a mobility in the molecular axis direction, for example, a high intramolecular mobility due to a delocalized π-electron can be utilized at a maximum. Furthermore, since a number of the linker molecules 7 can be bound to the fine particle 6, a conductive route of a network type as connected in a two-dimensionally or three-dimensionally reticulated state as a whole is formed, and the electric conduction in the conductor 8 is achieved through this conductive route of a network type. As a result, high mobility and high electric conductivity are obtained in the conductor 8.

In the insulating gate type field effect transistor 10, when a voltage is applied between the source electrode 3 and the drain electrode 4 as the opposing electrodes, an electron goes from the source electrode 3 into the organic semiconductor molecule 5 bound to the side surface of the source electrode 3; comes into the conductor 8; passes through the conductor 8; goes into the organic semiconductor molecule 5 bound to the side surface of the drain electrode 4; and flows into the drain electrode 4. As a result, a channel region 9 composed of the semiconductor molecule 5 is formed in two regions interposed between each of the source electrode 3 and the drain electrode 4 and the conductor 8. As described below, a characteristic of the field effect transistor 10 is determined by the characteristic of the organic semiconductor molecule 5 which forms the two channel regions 9.

That is, the conductivity in the organic semiconductor molecule 5 is relatively low, whereas the conductivity of the conductor 8 is high. Accordingly, the conductivity between the opposing electrodes 3 and 4 is substantially determined by the conductivity of the organic semiconductor molecule 5 occupying the two channel regions 9. The conductor 8 does not substantially affect the characteristic of the field effect transistor 10, electrically connects the two channel regions 9 each other and functions as a practically effective electrode for giving and receiving an electron with the organic semiconductor molecule 5. In this way, in the field effect transistor 10, a semiconductor device (field effect transistor) 10a in which the source electrode 3 and the conductor 8 work as substantially opposing electrodes and the organic semiconductor molecule 5 works as a channel material and a semiconductor device (field effect transistor) 10b in which the conductor 8 and the drain electrode 4 work as substantially opposing electrodes and the organic semiconductor molecule 5 works as a channel material are practically effectively formed; and the field effect transistor 10 can be considered such that these two semiconductor devices 10a and 10b are connected in series by the conductor 8.

As illustrated in FIG. 1A, in the two semiconductor devices 10a and 10b, the organic semiconductor molecule 5 is bound to the source electrode 3 or the drain electrode 4 as one of the opposing electrodes in the electrode binding part 5a and bound to the conductor 8 as the other opposing electrode in the conductor binding part 5c. Therefore, the charge transfer in the channel region 9 is achieved chiefly by means of intramolecular charge transfer, and the mobility or the like is not restricted by the intermolecular charge transfer. Accordingly, with respect to the conductivity, it is thought that the field effect transistor 10 is able to realize the performance equal to that of the molecular transistor as described in the above-mentioned Non-Patent Document 1 or 2. Furthermore, since the gate electrode 1 is provided via the gate insulating film 2, the conductivity in the channel region 9 is effectively subjected to electric-field control.

As is clear from FIG. 1A, the gate electrode is able to make gate electric field act on the channel region 9. Since it is sufficient that a gate electrode is positioned in the vicinity of the channel region 9, the gate electrode may be provided upon being patterned in such a way.

It is suitable that the gate insulating film 2 is constituted of a usually used inorganic oxide such as silicon oxide or an organic insulating high-molecular weight material such as polyethylene terephthalate (PET), polymethyl methacrylate (PMMA) and polyvinylphenol (PVP).

Also, it is suitable that the source electrode 3 and the drain electrode 4 are each composed of a metal, for example, gold (Au), silver (Ag), platinum (Pt), chromium (Cr), copper (Cu), palladium (Pd), aluminum (Al) and titanium (Ti); an inorganic semiconductor, for example, silicon doped with impurities and having enhanced conductivity; graphite; an organic conductive material, for example, poly(3,4-ethylenedioxythiophene)/polystyrene sulfonic acid (PEDOT/PSS); or a combined material thereof.

The transistor formed on the substrate 1 may be utilized as a monolithic integrated circuit in which a number of transistors are integrated together with the substrate 1 as in the case where it is applied as a display or may be utilized as a discrete part upon being individualized by cutting each transistor.

In the field effect transistor 10, a distance between the source electrode 3 and the drain electrode 4 is usually from about 5 to 50 μm and about 100 nm at a minimum. The majority of this gap part is occupied by the conductor 8, and processing precision of a micrometer level is sufficient. Therefore, the field effect transistor 10 can be easily prepared by a semiconductor technology of the related art. (Each of the source electrode 3 and the drain electrode 4 has a height of from about 20 to 50 nm and a length of from about 5 to 10 μm.) In the field effect transistor 10, a distance between the source electrode 3 or the drain electrode 4 functioning as an opposing electrode in the practically effective semiconductor device 10a or 10b and the conductor 8 opposite thereto is required to have the precision of a nanometer level. As described below, it is possible to easily control this distance with precision of a nanometer level according to a self-organization method.

FIGS. 2A to 2D are each a cross-sectional view showing a flow of preparation steps of the insulating gate type field effect transistor 10 on the basis of Embodiment 1. On the assumption that a silicon substrate doped with impurities is used as the substrate 1 and that gold is used as a material of each of the source electrode 3, the drain electrode 4 and the fine particle 6, its preparation steps are described.

Figure 2A:
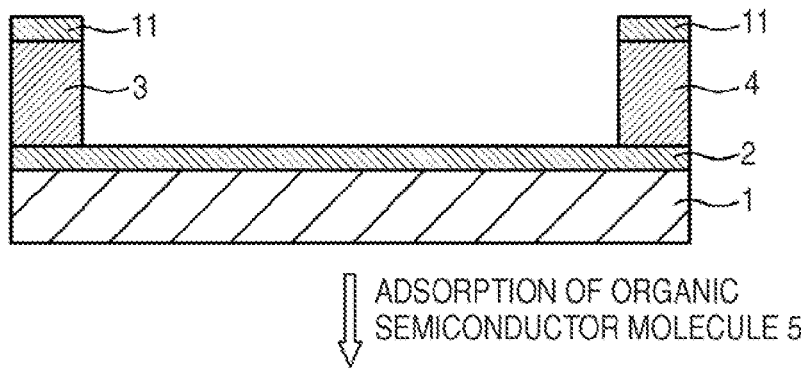
FIGS. 2A to 2D are each a cross-sectional view showing a flow of preparation steps of an insulating gate type field effect transistor according to an embodiment.

First of all, as illustrated in FIG. 2A, the gate insulating film 2 composed of silicon oxide is formed on the surface of the substrate 1 by means of thermal oxidation or the like. Next, the source electrode 3, the drain electrode 4 and the insulating film 11 are formed by a known method such as a lift-off method.

For example, first of all, after forming a photoresist layer on the entire surface of the gate insulating film 2 by a coating method or the like, patterning is applied by means of photolithography to form a mask layer for covering a region other than the region where the source electrode 3 and the drain electrode 4 are formed. Next, an electrode material layer composed of gold or the like is formed on the entire surface by means of vapor deposition or the like; and an insulating material layer composed of an inorganic oxide such as silicon oxide and aluminum oxide is formed in a thickness of about 5 nm by a physical vapor phase epitaxy method such as a sputtering method and a vacuum vapor position method or a chemical vapor phase epitaxy method. Next, by dissolving and removing the mask layer to remove the electrode material layer and the insulating material layer accumulated thereon, only the source electrode 3, the drain electrode 4 and the insulating film 11 are left.

Figure 2B:
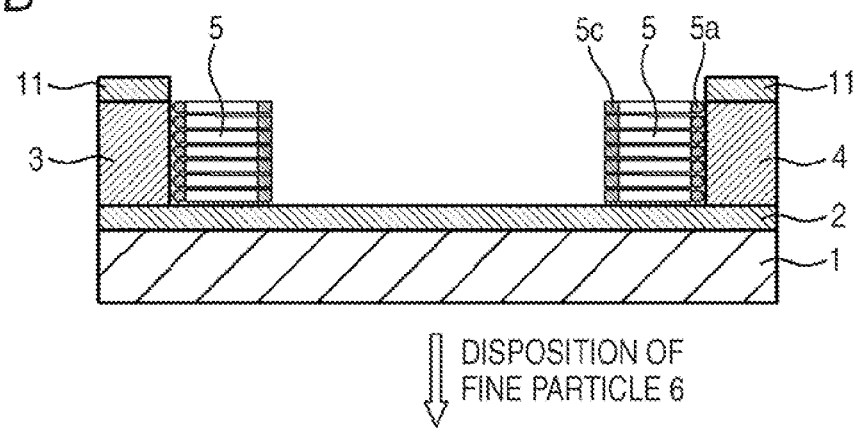

Next, as illustrated in FIG. 2B, by dipping the substrate 1 in a solution containing the organic semiconductor molecule 5 or exposing the substrate 1 to a vapor of the organic semiconductor molecule 5, a monomolecular film composed of the semiconductor molecule 5 is formed on the side surface of each of the source electrode 3 and the drain electrode 4 by the action of self-organization of the organic semiconductor molecule 5 itself. In this monomolecular film, the respective molecule 5 is bound to the side surface of the electrode in the electrode binding part 5a; the length direction of the molecule 5 is made intersected with the side surface of the electrode; and the molecules gather so as to come into contact with each other on the side surfaces of the molecules. As a result, the thickness of the monomolecular film is equal to the length of the molecule 5 and constant; and the conductor binding parts 5c of the semiconductor molecules 5 are entirely and closely arrayed on the surface of the monomolecular film (surface on the opposite side to the electrode). On that occasion, in order that the conductor binding part 5c may not be bound to the electrode, it is desirable that the organic semiconductor molecule 5 is aligned such that the conductor binding part 5c becomes more distant from the surface of the electrode.

Figure 2C:
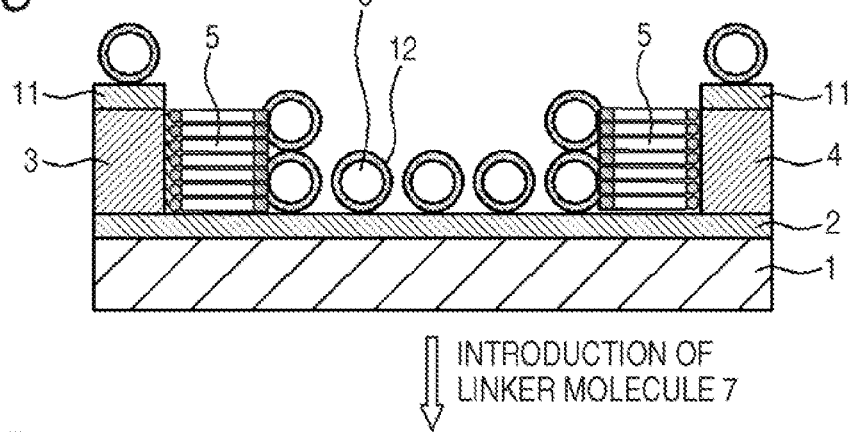

Next, as illustrated in FIG. 2C, the fine particle 6 whose surface is covered by a protective film molecule 12 for preventing coagulation is disposed on the gate insulating film 2 between the source electrode 3 and the drain electrode 4 each having the organic semiconductor molecule 5 bound thereto by a dipping method, a casting method, a Longmuir-Blodgett (LB) method, an inkjet method, a stamp method or other methods. On that occasion, the fine particle 6 is disposed in a sufficient area such that it bridges the both electrode. However, in order to reduce a gate leak current, it is avoided that the fine particle 6 is disposed in an area meaninglessly broader than the distance between the electrodes.

For example, in the case where the fine particle 6 is disposed by a dipping method, the substrate 1 is dipped in a dispersion having the gold fine particle 6 dispersed in a solvent such as toluene and chloroform (concentration: several mM) for several minutes to several hours, and thereafter, the solvent is vaporized. The gold fine particle 6 is thus disposed on the surface of the substrate 1.

In the casting method, a dispersion having the gold fine particle 6 dispersed in a solvent such as toluene and chloroform is dropped on the substrate, and the solvent is then vaporized step by step. The gold fine particle 6 is thus disposed on the surface of the substrate 1.

In the LB method, a dispersion having the gold fine particle 6 dispersed in a solvent such as toluene and chloroform is spread on the surface of water which has been allowed to stand, thereby forming a gold fine particle layer. Next, the gold fine particle layer is transferred onto the substrate 1 by means of water level lowering or the like, thereby disposing the gold fine particle 6 on the surface of the substrate 1.

In the stamp method, a gold fine particle layer formed on the surface of a solid or the surface of water by a casting method or an LB method is once transferred onto a surface of polydimethylsiloxane or the like, which is then pressed on the substrate 1 as in a stamp, thereby disposing the gold fine particle 6 on the surface of the substrate 1.

The gold fine particle 6 is a colloid particle having a particle size of 10 nm or less. In order to stably dispersing this gold fine particle 6 in a solvent such as toluene and chloroform, it is necessary to deposit the protective film molecule 12 for preventing coagulation and precipitation of the gold fine particles 6 each other from occurring, thereby converting the fine particle 6 in a state that it is covered by the protective film molecule 12. The gold fine particle 6 is introduced in this state on the substrate 1. In the gold fine particle 6 disposed in a position where it comes into contact with the organic semiconductor molecule 5, a part of the protective film molecule 12 is substituted with the conductor binding part 5c of the organic semiconductor molecule 5, and a bond between the conductor binding part 5c of the organic semiconductor molecule 5 and the gold fine particle 6 is formed.

Figure 2D:
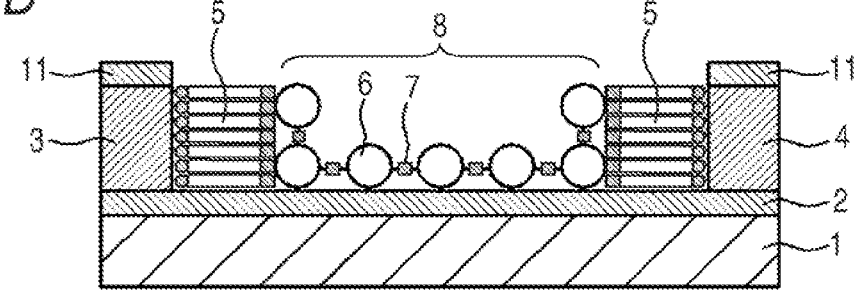

Next, the substrate 1 is dipped in a solution containing the linker molecule 7; the protective film molecule 12 is substituted with the linker molecule 7; and as illustrated in FIG. 2D, the adjacent fine particles 6 are connected each other by the linker molecule 7 to form the conductor 8. Thereafter, the unnecessary fine particle 6 which is not connected to the organic semiconductor molecule 5 is dispersed in a solvent or the like and removed together with the solvent.

Good electric conductivity of the conductor 8 is realized by means of connection by the linker molecule 7. This connection by the linker molecule 7 conforms to a method as described in WO 2004/006337 (or JP-A-2004-88090). Also, as described in JP-A-2006-100519, it is possible to form a structure where the fine particles are connected each other by a complex molecule by binding a molecule capable of becoming a ligand of an organic metal complex onto the surface of the fine particle layer immobilized on the source/drain electrode pattern and subsequently introducing a metal ion.

As illustrated in FIGS. 2C and 2D, by depositing, on the surface of the monomolecular film of the already formed organic semiconductor molecule 5, the fine particle 6 composed of a material which is easily bound to the conductor binding part 5c forming this surface, the conductor 8 is formed by "post attachment". Therefore, it is possible to make a distance between each of the source electrode 3 and the drain electrode 4 and the conductor 8 opposite thereto automatically equal to the length of the semiconductor molecule 5. According to this method, since the practically effective opposing electrodes with precision of a nanometer level in terms of the size of a gap can be formed "in combination" with the already formed monomolecular film, it is possible to easily realize the precision of a nanometer level.

Figure 3A:
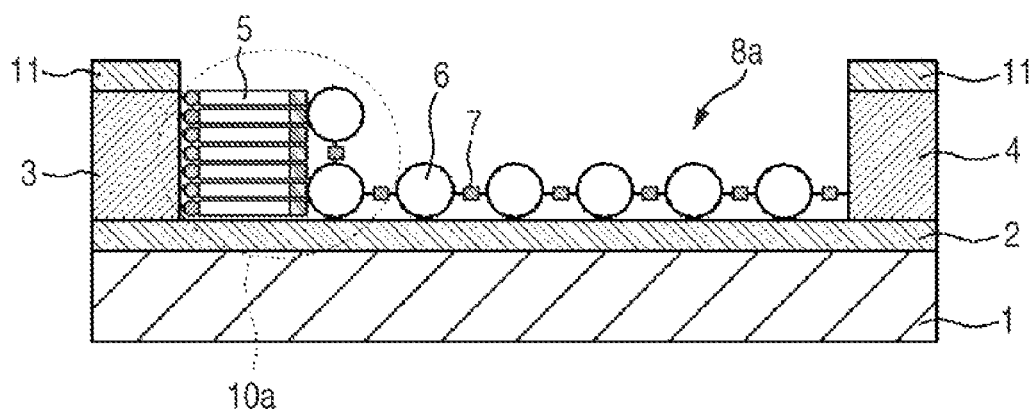
FIGS. 3A and 3B are each a diagrammatic cross-sectional view showing a structure of an insulating gate type field effect transistor according to a modification of an embodiment.
Figure 3B:
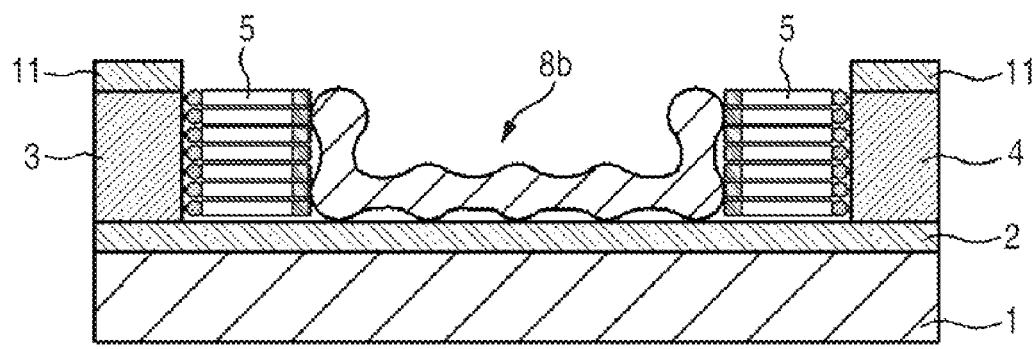

FIGS. 3A and 3B are each a diagrammatic cross-sectional view showing a structure of an insulating gate type field effect transistor according to a modification on the basis of Embodiment 1.

FIG. 3A shows an example of an insulating gate type field effect transistor according to a modification on the basis of Embodiment 1. In this transistor, the organic semiconductor molecule 5 is disposed only in either one of the source electrode 3 and the drain electrode 4 (the source electrode 3 in FIG. 3A). On the other electrode in which the organic semiconductor molecule 5 is not disposed (the drain electrode 4 in FIG. 3A), the fine particle 6 of the conductor 8a is connected to the drain electrode 4 via the linker molecule 7.

In that case, the practically effective semiconductor device 10a is formed only on the side of the source electrode 3, and the total length of the channel region is a half of the insulating gate type field effect transistor 10 in which the organic semiconductor molecule 5 is disposed in the both electrodes. In the case where a sufficient channel length cannot be realized by the length of one molecule of the organic semiconductor molecule 5, this structure cannot be taken. However, in the case where a sufficient channel length can be realized by the length of one molecule of the organic semiconductor molecule 5, this structure can be taken. In that case, since the organic semiconductor molecule 5 is provided only in either one of the source electrode 3 and the drain electrode 4 (the source electrode 3 in FIG. 3A), there are advantages that it is simple to set up a voltage between the source and the drain; that an optimal voltage can be applied to the semiconductor molecule 5; and that this insulating gate type field effect transistor can be driven at a low voltage as compared with the insulating gate type field effect transistor 10. In this field effect transistor, in disposing the organic semiconductor molecule 5, it is necessary that the electrode in which the organic semiconductor molecule 5 is not disposed (the drain electrode 4 in FIG. 3A) is masked.

FIG. 3B shows an example of an insulating gate type field effect transistor according to another modification on the basis of Embodiment 1. In this transistor, the fine particles 6 are not connected by the linker molecule 7, but the adjacent fine particles 6 are fused each other to form a conductor 8b in a thin film state. In that case, there is an advantage that the electric conductivity of the conductor 8b can be made high because it is not restricted by the electric conductivity of the linker molecule 7.

As a method for forming a conductor 8b in a thin film state by fusing the fine particles 6 each other, in addition to light irradiation and heating, a method for chemically removing the protective film deposited on the fine particle 6 is employable, too. In that case, when the fine particles 6 are disposed in a prescribed region and then dipped in a solvent capable of dissolving only the protective film therein to remove the protective film, the fine particles 6 are fused each other, and the conductor 8b with high electric conductivity in a thin film state is formed. It is suitable that the particle size of the fine particle 6 is not more than 10 nm.

Embodiment 2

A semiconductor device configured as an insulating gate type field effect transistor having a top-gate type structure and a method for manufacturing the same are described.

Figure 4:
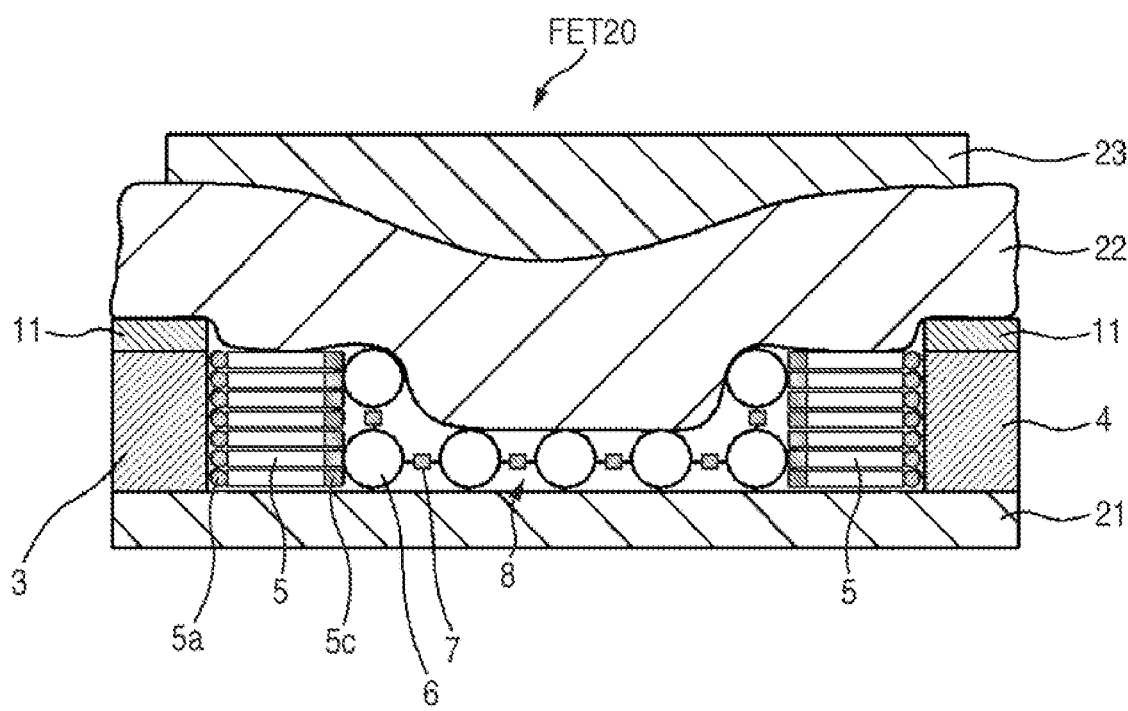
FIG. 4 is a diagrammatic cross-sectional view showing a structure of an insulating gate type field effect transistor according to another embodiment.

FIG. 4 is a diagrammatic cross-sectional view showing a structure of an insulating gate type field effect transistor (FET) 20 on the basis of Embodiment 2. Since the transistor 20 is different from the insulating gate type field effect transistor (FET) 10 only in a point that it is of a top-gate type structure, the insulating gate type field effect transistor 20 is described while emphasizing different points.

A substrate 21 is an insulating substrate and is, for example, a plastic substrate made of a polyimide, a polycarbonate, polyethylene terephthalate (PET), etc., a glass substrate, a quartz substrate, mica or the like. By using a plastic substrate, it is possible to manufacture a semiconductor device in a flexible shape, for example, a display having a curved shape.

The source electrode 3 and the drain electrode 4 each of which is composed of gold or the like are provided opposite on the surface of the substrate 21. The organic semiconductor molecule 5 is bound to the side surface of each of the source electrode 3 and the drain electrode 4 via the electrode binding part 5a. The conductor binding part 5c of the organic semiconductor molecule 5 is not bound to the electrode, and it is desirable that the conductor binding part 5c is aligned such that it becomes more distant from the electrode. Also, at least a part of the conductor binding part 5c is bound to the fine particle 6, and it is desirable that the conductor binding part 5c is bound to the fine particle 6 in a large amount as far as possible. Similar to Embodiment 1, the conductor 8 is formed by the fine particles 6 and the linker molecule 7 connecting them.

A gate insulating film 22 is formed on the top of the conductor 8 so as to fill a gap part between the source electrode 3 and the drain electrode 4, and a gate electrode 23 is provided via the gate insulating film 22. Examples of a material of the gate insulating film 22 which can be used include inorganic oxides such as silicon oxide and aluminum oxide; and organic insulating high-molecular weight materials such as polyethylene terephthalate (PET), polymethyl methacrylate (PMMA), polyvinylphenol (PVP) and polyimides. Also, examples of a material of the gate electrode 23 which can be used include metals such as gold (Au), silver (Ag), platinum (Pt), chromium (Cr), copper (Cu), palladium (Pd), aluminum (Al) and titanium (Ti); inorganic semiconductors such as silicon doped with impurities and having enhanced conductivity and indium tin oxide; graphite; organic conductive materials such as poly(3,4-ethylenedioxythiophene)/polystyrene sulfonic acid (PEDOT/PSS); and combined materials thereof.

FIGS. 5A to 5D and FIGS. 6E to 6F are each a cross-sectional view showing a flow of preparation steps of the insulating gate type field effect transistor 20. On the assumption that gold is used as a material of each of the source electrode 3, the drain electrode 4 and the fine particle 6, its preparation steps are described.

Figure 5A:
FIGS. 5A to 5D are each a cross-sectional view showing a flow of preparation steps of an insulating gate type field effect transistor according to an embodiment.

First of all, as illustrated in FIG. 5A, the source electrode 3, the drain electrode 4 and the insulating film 11 are formed on the surface of the substrate 21 by a known method such as a lift-off method.

Figure 5B:
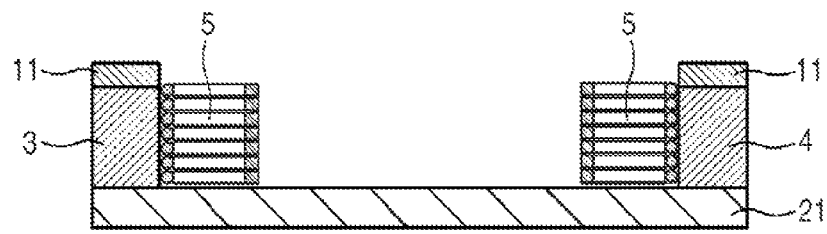

Next, as illustrated in FIG. 5B, by dipping the substrate 21 in a solution containing the organic semiconductor molecule 5 or exposing the substrate 21 to a vapor of the organic semiconductor molecule 5, the organic semiconductor molecule 5 is bound to the side surface of each of the source electrode 3 and the drain electrode 4 in a self-organization manner. On that occasion, the organic semiconductor molecule 5 is bound to the surface of the electrode in the electrode binding part 5a, and it is desirable that the conductor binding part 5c is aligned such that it becomes more distant from the surface of the electrode.

Figure 5C:
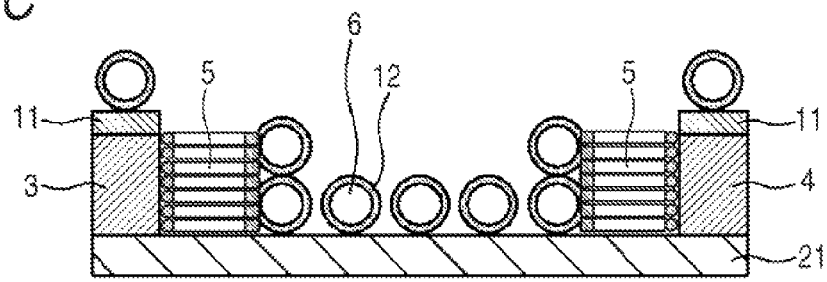

Next, as illustrated in FIG. 5C, in order to prevent coagulation, the fine particle 6 whose surface is covered by the protective film molecule 12 is disposed on the gate insulating film 2 between the source electrode 3 and the drain electrode 4 each having the organic semiconductor molecule 5 bound thereto by a dipping method, a casting method, a Longmuir-Blodgett (LB) method, an inkjet method, a stamp method or other methods.

Figure 5D:
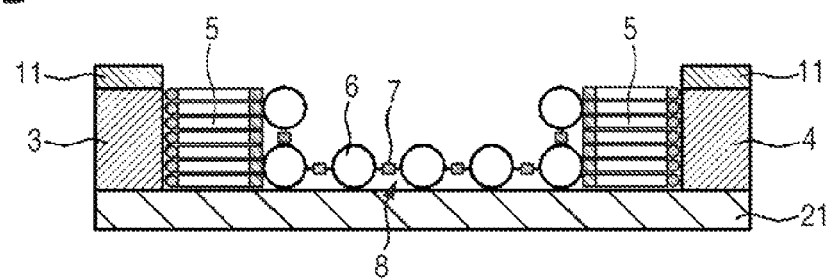

Next, the substrate 21 is dipped in a solution containing the linker molecule 7; the protective film molecule 12 is substituted with the linker molecule 7; and as illustrated in FIG. 5D, the adjacent fine particles 6 are connected each other by the linker molecule 7 to form the conductor 8.

Figure 6E:
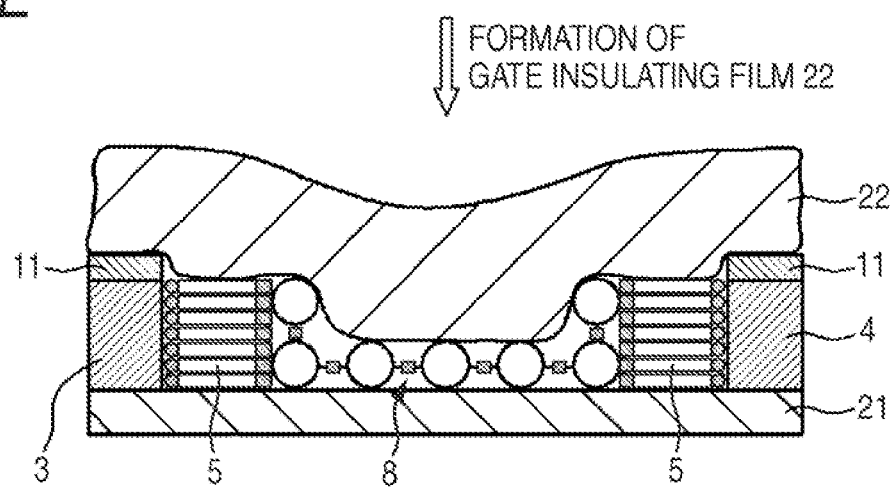
FIGS. 6E to 6F are each a cross-sectional view showing a flow of preparation steps of an insulating gate type field effect transistor according to an embodiment.

Next, as illustrated in FIG. 6E, a gate insulating film 22 is formed by a physical vapor phase epitaxy method such as a vacuum vapor deposition method and a sputtering method; a chemical vapor phase epitaxy method; a coating method such as a cast coating method, a spray coating method and a spin coating method; a printing method such as an inkjet method, a screen printing method, an offset printing method and a gravure printing method; a stamp method; a lift-off method; a dipping method; a casting method; or other methods.

Figure 6F:
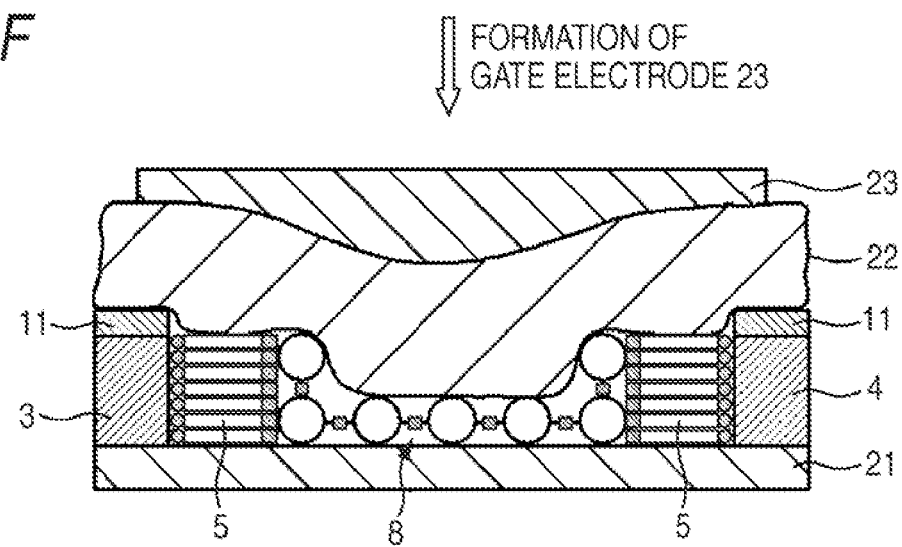

Next, as illustrated in FIG. 6F, a gate electrode 23 is formed by a physical vapor phase epitaxy method such as a vacuum vapor deposition method and a sputtering method; a chemical vapor phase epitaxy method; a coating method such as a cast coating method, a spray coating method and a spin coating method; a printing method such as an inkjet method, a screen printing method, an offset printing method and a gravure printing method; a stamp method; a lift-off method; a shadow masking method; a plating method; or other methods.

According to the present embodiment, since the processing temperature in the preparation steps can be controlled at no higher than 200° C., it is also possible to constitute all of the foregoing materials by an organic compound.

Embodiment 3

In Embodiment 3, an insulating gate type field effect transistor is described as an example relative to a semiconductor device in which each of a linker molecule and a semiconductor molecule has a metal complex part with high electric conductivity in an important part thereof. Also, as an example relative to a method for manufacturing the same, an example in which a protective film molecule bound to a fine particle is substituted with a first molecule; the first molecule is polymerized with a second molecule to form a precursor molecule bound to the fine particle; the fine particle is disposed in a prescribed position; and the adjacent precursor molecules are bound each other to form a linker molecule is described.

Figure 7A:
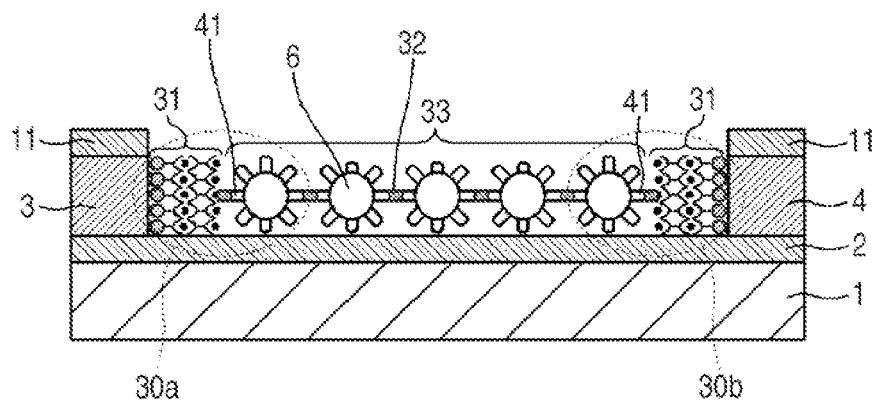
FIG. 7A is a diagrammatic cross-sectional view showing a structure of an insulating gate type field effect transistor according to yet another embodiment.

FIG. 7A is a diagrammatic cross-sectional view showing a structure of an insulating gate type field effect transistor (FET) 30 on the basis of Embodiment 3. As illustrated in FIG. 7A, the field effect transistor 30 is configured similar to the field effect transistor 10 as explained in Embodiment 1 but is different from the insulating gate type field effect transistor 10 only in a point that each of the semiconductor molecule 31 and the linker molecule 32 has a metal complex part with high electric conductivity. The insulating gate type field effect transistor 30 is described while emphasizing different points.

The substrate 1 also acts as a gate electrode and is, for example, an n-type silicon substrate doped with impurities and having conductivity. The gate insulating film 2 composed of silicon oxide or the like is provided on the surface of the substrate 1, and the source electrode 3 and the drain electrode 4 each of which is composed of gold or the like are provided opposite thereon.

Figure 7B:
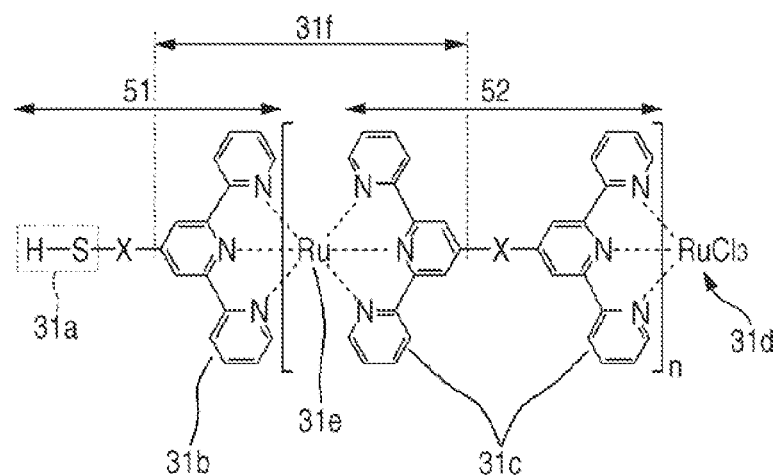
FIGS. 7B and 7C are each a diagrammatic explanatory view showing structures of a semiconductor molecule and a conductor, respectively.

A monomolecular film composed of a semiconductor molecule 31 is formed on a side surface of each of the source electrode 3 and the drain electrode 4. As illustrated in FIG. 7B, the semiconductor molecule 31 is composed of a ligand molecule 51 having an electrode binding part 31$a$ capable of binding to the electrode 3 or 4 and a ligand part 31$b$ at both ends of the molecule, respectively; a ligand molecule 52 having two ligand parts 31$c$ at both ends of the molecule; and a metal ion 31$e$ capable of binding the ligand molecules 51 and 52 or the ligand molecules 52 by forming a metal complex part 31$f$ together with a conductor binding part 31$d$ and the ligand parts 31$b$ and/or 31$c$. Thought X may be absent, examples thereof include a single or plural number of an ethynylene group (—C≡C—), a vinylene group (—CH=CH—) and a phenylene group. In order to form the monomolecular film with good reproducibility, it is suitable that the organic semiconductor molecule 5 has a long and narrow shape and that the molecular skeleton part 5$b$ has an adequate length, for example, from 5 to 100 nm.

In this monomolecular film, the respective semiconductor molecule 31 is bound to the side surface of the electrode by the electrode binding part 31$a$ in one end part thereof, the length direction of the molecule is made intersected with the side surface of the electrode; and the molecules gather so as to come into contact with each other on the side surfaces of the molecules due to an intermolecular force. As a result, the thickness of the monomolecular film is equal to the length of the molecule and constant; and the conductor binding parts 31$d$ as the other end parts of the semiconductor molecules are entirely and closely arrayed on the surface of the monomolecular film (surface on the opposite side to the electrode). As illustrated in FIG. 7A, the conductor binding part 31$d$ is not bound to the electrode, and it is desirable that the conductor binding part 31$d$ is aligned such that it becomes more distant from the electrode. Also, at least a part of the conductor binding part 31$d$ is bound to a connecting part 43 of a precursor molecule 41 bound to the fine particle 6, and it is desirable that the conductor binding part 31$d$ is bound to the connecting part 43 of the precursor molecule 41 in a large amount as far as possible. The precursor molecule 41 is described later in detail.

As the electrode binding part 31$a$ capable of binding to the electrode 3 or 4, in the case where the electrode is composed of gold (Au), examples thereof include a thiol group (—SH), a disulfide group (—S—S—), an amino group (—NH2), a cyano group (—CN) and an isocyano group (—NC). Also, in the case where the connecting part 43 is composed of a conjugated ligand such as ferrocene, pyridine, bipyridine, terpyridine, phenanthroline, quinolinol and quinoline, it is suitable that the conductor binding part 31$d$ capable of binding to the connecting part 43 of the precursor molecule 41 is, for example, a conjugated ligand having a central metal ion such as Ru3+.

The organic semiconductor molecule 5 desirably has a conjugated system and more desirably has a conjugated system over the whole of the molecule. In addition, as a characteristic feature of the present embodiment, the organic semiconductor molecule 31 contains the metal complex part 31$f$ with high conductivity. Examples of the metal complex part 31$f$ include a complex part in which the ligand parts 31$b$ and 31$c$ each of which is composed of a conjugated ligand such as ferrocene, pyridine, bipyridine, terpyridine, phenanthroline, quinolinol and quinoline are coordinated in the metal ion 31$e$ such as Ru3+; and a structure in which plural units of this complex part are connected. In order that the electric field from the gate electrode 1 may effectively act on the organic semiconductor molecule 31 without being blocked by the fine particle 6, it is suitable that the molecular length of the organic semiconductor molecule 31 is long such that a distance between the electrode 3 or 4 and the fine particle 6 is large.

Figure 7C:
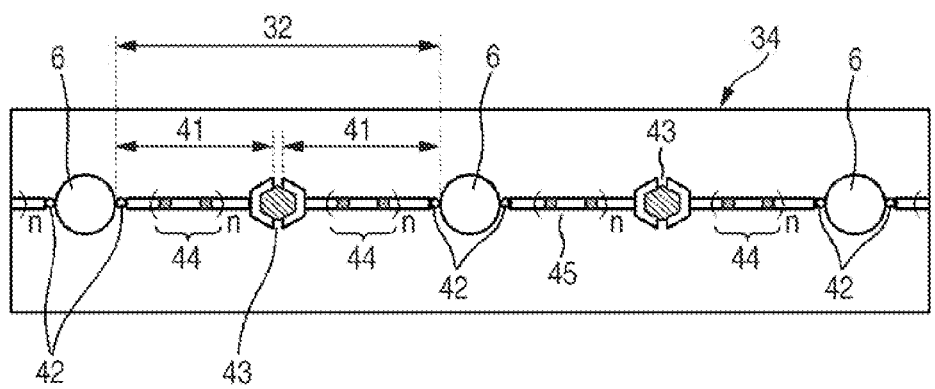

A conductor 33 is disposed between a monomolecular film of the semiconductor molecule 31 formed in the source electrode 3 and a monomolecular film of the semiconductor molecule 31 formed in the drain electrode 4. As illustrated in FIG. 7C, the conductor 33 is configured of the fine particles 6 and a linker molecule 32 connecting them and bound to the conductor binding part 31$d$ of the semiconductor molecule 31 by the connecting part 43 of the precursor molecule 41 bound to the fine particles 6 at the both ends thereof. The fine particle 6 is a fine particle having a particle size of not more than 10 nm. As a material thereof, materials having high electric conductivity, for example, conductors of a metal such as gold (Au), silver (Ag), platinum (Pt), copper (Cu), palladium (Pd) and iron (Fe); and semiconductors such as silicon (Si) doped with impurities and having enhanced conductivity are useful.

The linker molecule 32 which connects the fine particles 6 each other has a functional group capable of binding to the fine particles 6 in a binding part 42 at the both ends thereof. In the case where the fine particle is composed of gold (Au), examples of the functional group which the linker molecule 32 has at the both ends thereof include a thiol group (—SH), a disulfide group (—S—S—), an amino group (—NH2), a cyano group (—CN) and an isocyano group (—NC). The linker molecule 32 desirably has a conjugated system so as to exhibit excellent conductivity and more desirably has a conjugated system over the whole of the molecule.

As a characteristic feature of the present embodiment, the linker molecule 32 is formed through binding of the precursor molecule 41 bound to the fine particle 6 and the other precursor molecule 41 bound to the fine particle 6 adjacent to the fine particle 6 each other in the connecting part 43. Also, the precursor molecule 41 is formed by polymerizing the first molecule bound to the fine particle 6 with the second molecule.

A conductive part 44 having a conjugated system in a molecular skeleton thereof is disposed between the binding part 42 and the connecting part 43 such that excellent conductivity can be exhibited. A principal part of this conductive part 44 is formed by a repetition of the same structural unit 45. Furthermore, as a characteristic feature of the present embodiment, the conductive part 44 contains a metal complex part with high conductivity. Similar to the case as described previously regarding the semiconductor molecule 31, examples of this metal complex part include a complex part of a conjugated ligand such as ferrocene, pyridine, bipyridine, terpyridine, phenanthroline, quinolinol and quinoline and a metal ion; and a structure in which plural units of this complex part are connected. The molecular length of the linker molecule 32 is a length sufficient for connecting the fine particles 6 each other, and for the purpose of enhancing the electric conductivity of the linker molecule 32, it is suitable that the molecular length of the linker molecule 32 is short as far as possible.

In the conductor 33, the linker molecule 32 is bound to the fine particles 6 via a functional group present at the both ends thereof, and the fine particle 6 and the linker molecule 32 are alternately connected, whereby a conductive route 34 in which a conductive route within the fine particle 6 and a conductive route within the linker molecule 32 are connected is formed. In this conductive route, since the charge transfer within the linker molecule 32 dominantly occurs in a molecular axis direction along the principal chain thereof, a mobility in the molecular axis direction, for example, a high intramolecular mobility due to a delocalized π-electron can be utilized at a maximum. Furthermore, since a number of the linker molecules 32 can be bound to the fine particle 6, a conductive route of a network type as connected in a two-dimensionally or three-dimensionally reticulated state as a whole is formed, and the electric conduction in the conductor 33 is achieved through this conductive route of a network type. As a result, high mobility and high electric conductivity are obtained in the conductor 33.

Similar to the case as described previously regarding the field effect transistor 10, in the field effect transistor 30, when a voltage is applied between the source electrode 3 and the drain electrode 4 as the opposing electrodes, an electron goes from the source electrode 3 into the organic semiconductor molecule 31 bound to the side surface of the source electrode 3; comes into the conductor 33; passes through the conductor 33; goes into the semiconductor molecule 31 bound to the side surface of the drain electrode 4; and flows into the drain electrode 4. As a result, a channel region composed of the semiconductor molecule 31 is formed in two regions interposed between each of the source electrode 3 and the drain electrode 4 and the conductor 33. Similar to the field effect transistor 10, a characteristic of the field effect transistor 30 is determined by the characteristic of the semiconductor molecule 31 which forms the two channel regions.

That is, the conductivity in the semiconductor molecule 31 is relatively low, and the conductivity of the conductor 33 is high. Therefore, the conductivity between the opposing electrodes 3 and 4 is substantially determined by the conductivity of the semiconductor molecule 31 occupying the two channel regions. The conductor 33 does not substantially affect the characteristic of the field effect transistor 30, electrically connects the two channel regions each other and functions as a practically effective electrode for giving and receiving an electron with the semiconductor molecule 31. In this way, in the field effect transistor 30, a semiconductor device (field effect transistor) 30a in which the source electrode 3 and the conductor 33 work as substantially opposing electrodes and the organic semiconductor molecule 31 works as a channel material and a semiconductor device (field effect transistor) 30b in which the conductor 33 and the drain electrode 4 work as substantially opposing electrodes and the organic semiconductor molecule 31 works as a channel material are practically effectively formed; and the field effect transistor 30 can be considered such that these two semiconductor devices 30a and 30b are connected in series by the conductor 33.

As illustrated in FIG. 7A, in the two semiconductor devices 30a and 30b, the semiconductor molecule 31 is bound to the source electrode 3 or the drain electrode 4 as one of the opposing electrodes in the electrode binding part 31a and bound to the conductor 33 as the other opposing electrode in the conductor binding part 31d. Therefore, the charge transfer in the channel region is achieved chiefly by means of intramolecular charge transfer, and the mobility or the like is not restricted by the intermolecular charge transfer. Accordingly, with respect to the conductivity, it is thought that the field effect transistor 30 is able to realize the performance equal to that of the molecular transistor as described in the above-mentioned Non-Patent Document 1 or 2. Furthermore, since the gate electrode 1 is provided via the gate insulating film 2, the conductivity in the channel region is effectively subjected to electric-field control.

In addition, the linker molecule 32 contains a metal complex part with high conductivity, and the conductor 33 with higher conductivity can be formed. Also, by using the organic semiconductor molecule 31 having the metal complex part 31f, it is possible to expect a higher modulation effect and revealment of a new function by utilizing diversity of the structure and nature of the metal complex.

FIGS. 8A to 8D and FIGS. 9E to 9F are each a cross-sectional view showing a flow of preparation steps of the insulating gate type field effect transistor 30. On the assumption that a silicon substrate doped with impurities is used as the substrate 1 and that gold is used as a material of each of the source electrode 3, the drain electrode 4 and the fine particle 6, its preparation steps are described. Also, the matter that the organic semiconductor molecule 31 and the precursor molecule 41 are synthesized in the same kind of reaction by using the same kind of materials is convenient because a reaction for connecting the precursor molecules 41 each other to form the linker molecule 32 and a reaction for connecting the organic semiconductor molecule 31 and the precursor molecule 41 to bind the organic semiconductor molecule 31 and the conductor 33 each other can be simultaneously carried out. Thus, such an example is described.

Figure 8A:
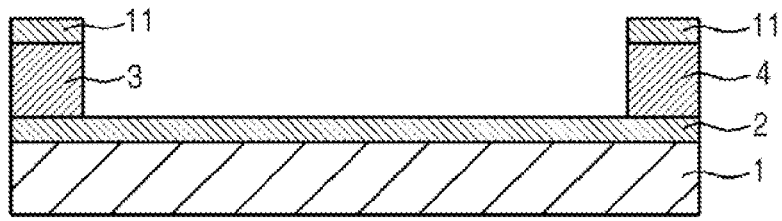
FIGS. 8A to 8D are each a cross-sectional view showing a flow of preparation steps of an insulating gate type field effect transistor according to an embodiment.

First of all, as illustrated in FIG. 8A, the gate insulating film 2 composed of silicon oxide is formed on the surface of the substrate 1 by means of thermal oxidation or the like. Next, the source electrode 3, the drain electrode 4 and the insulating film 11 are formed on the gate insulating film 2 by a known method such as a lift-off method.

Figure 8B:
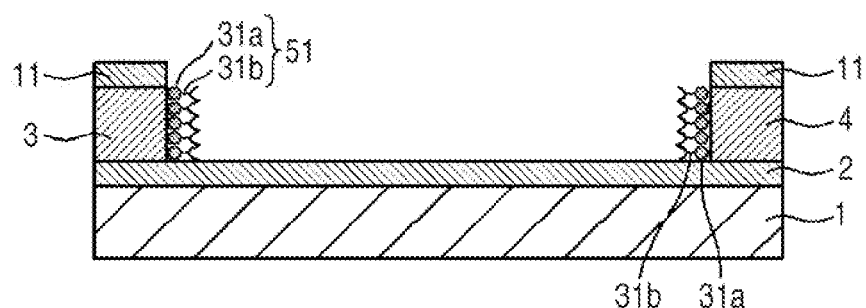
Figure 10:
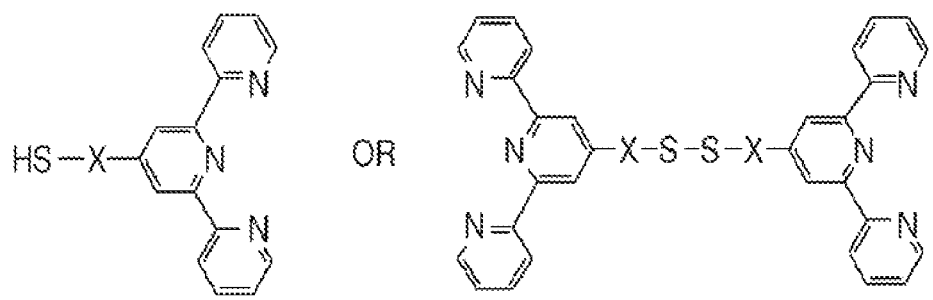
FIG. 10 is an explanatory view showing an example of a synthesis reaction of a semiconductor molecule and a precursor molecule according to an embodiment.
Figure 10:
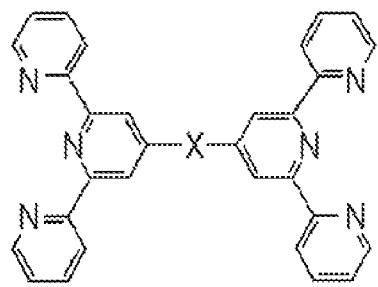

Next, as illustrated in FIG. 8B, by dipping the substrate 1 in a solution containing the ligand molecule 51 or exposing the substrate 1 to a vapor of the ligand molecule 51, the ligand molecule 51 is formed on the side surface of each of the source electrode 3 and the drain electrode 4 in a self-organization manner. The ligand molecule 51 is, for example, a molecule represented by a structural formula as illustrated in FIG. 10 and is bound to the surface of the electrode by the electrode binding part 31a according to Reaction 1. On that occasion, it is desirable that the ligand molecule 51 is aligned such that the ligand part 31b becomes more distant from the surface of the electrode.

Figure 8C:
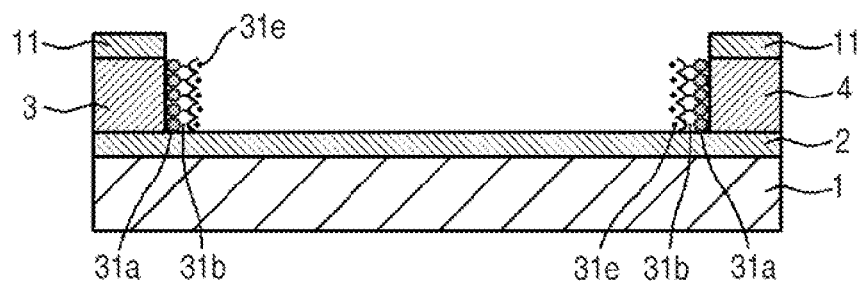

Next, as illustrated in FIG. 8C, by dipping the substrate 1 in a solution containing the metal ion 31e, the metal ion 31e is bound to the ligand part 31b according to Reaction 2 as illustrated in FIG. 10.

Figure 8D:
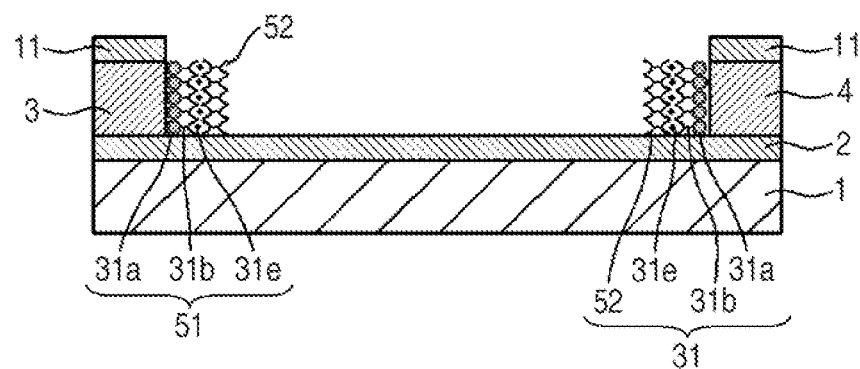

Next, as illustrated in FIG. 8D, by dipping the substrate 1 in a solution containing the ligand molecule 52, the ligand part 31c of the ligand molecule 52 is bound to the metal ion 31e according to Reaction 3 as illustrated in FIG. 10, thereby forming the metal complex part 31f with high electric conductivity, which is composed of the ligand part 31b, the ligand part 31c and the metal ion 31e. Thereafter, Reaction 2 and Reaction 3 are repeated in a necessary number of times, thereby obtaining the semiconductor molecule 31 having a prescribed length.

Figure 9E:
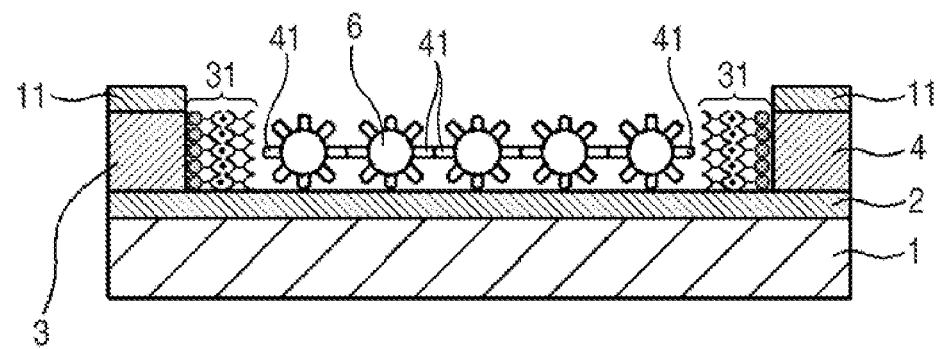
FIGS. 9E to 9F are each a cross-sectional view showing a flow of preparation steps of an insulating gate type field effect transistor according to an embodiment.

Next, as illustrated in FIG. 9E, a single particle film composed of the fine particle 6 having the precursor molecule 41 bound thereto is prepared by a dipping method, a casting method, a Longmuir-Blodgett (LB) method, an inkjet method, a stamp method or other methods and disposed on the surface of the substrate 1 having the source electrode 3 and the drain electrode 4 formed thereon. At that time, it is desirable that the fine particle 6 forms a two-dimensional regular arrangement on the basis of hexagonal closest packing.

<Synthesis of Precursor Molecule Bound to Fine Particle>

Figure 12:
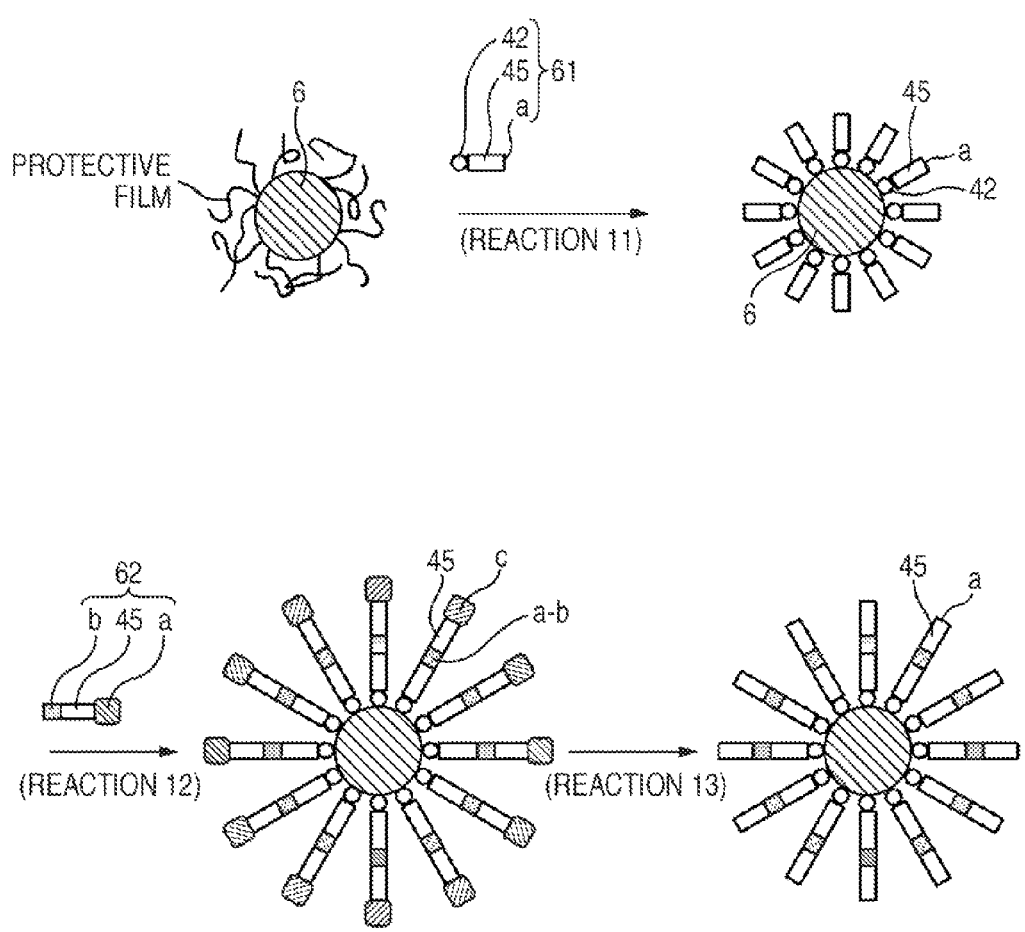
FIG. 12 is an explanatory view showing a synthesis route of a precursor molecule according to an embodiment.

FIG. 12 is an explanatory view showing a synthesis route of the precursor molecule 41 bound to the fine particle 6. A synthesis method of the precursor molecule 41 is hereunder described.

First of all, the fine particle 6 whose surface is covered by a protective film for preventing the fusion of fine particles each other is synthesized by a known method. A reaction molecule 61 corresponding to the first molecule is introduced into a solution having this fine particle 6 dispersed therein, and the protective film molecule is substituted according to Reaction 11. The reaction molecule 61 is a molecule having the structural unit 45 with high electric conductivity, for example, a conjugated system and having the binding part (functional group capable of binding to the fine particle 6) 42 to be bound to the fine particle 6 in one of end parts thereof and a reaction site a which during polymerization with a reaction molecule 62 as described later, works as a reaction site with a reaction site b of the reaction molecule 62 in the other end part. As a result of Reaction 1, the reaction molecule 61 is physically and electrically bound to the fine particle 6. Thereafter, the molecule 61 which is not bound to the fine particle 6 is removed from the solution by a method such as ultrafiltration, solvent extraction, size exclusion chromatography and electrophoresis.

Next, a reaction molecule 62 having the structural unit 45 and having the reaction site a and the reaction site b at both ends thereof, the reaction site a being inactivated by a protective group c, is introduced. The reaction molecule 62 reacts with the reaction site a of the reaction molecule 61 by the reaction site b according to Reaction 12, whereby the reaction molecule 62 and the reaction molecule 61 are polymerized. Thereafter, the unreacted molecule 62 is removed from the solution by a method such as ultrafiltration, solvent extraction, size exclusion chromatography and electrophoresis.

Next, the protective group c bound to the reaction site a of the reaction molecule 62 is removed according to Reaction 13, thereby converting the reaction site a in a reaction active state.

Thereafter, Reaction 12 and Reaction 13 are repeated, and the conductive part 44 forms a polymer molecule having a prescribed length by a repetition of the structural unit 45.

Next, if desired, a reaction molecule 63 having the reaction site b and the connecting part 43 at both ends of the molecule, thereby introducing the connecting part 43 into the polymer molecule (Reaction 14). Though an example in which the reaction molecule 63 is composed only of the reaction site b and the connecting part 43 is illustrated in FIG. 10, the structural unit 45 and the like may be contained midway. The synthesis of the precursor molecule 41 having the fine particle 6 bound thereto is thus accomplished.

Though various molecules can be used as the reaction molecule, the ligand molecules 51 and 52 used for the synthesis of the semiconductor molecule 31 can be used as the reaction molecules 61 and 62, respectively. In that case, Reaction 1 to Reaction 3 are corresponding to Reaction 11 to Reaction 13, respectively. That is, the reaction molecule 61 has X such as a phenylene group as the structural unit 45 with high electric conductivity and has a thiol group as the binding part 42 in one of end parts thereof and a terpyridyl group as the reaction site a in the other end part thereof. The reaction molecule 62 has X such as a phenylene group as the structural unit 45 with high electric conductivity and has a terpyridyl group as the reaction sites b and a in both end parts of the molecule, respectively. Since the terpyridyl group is easily coordinated in a ruthenium(III) ion (Ru3+), the reaction molecules can be connected each other according to a complex forming reaction with Ru3+ as illustrated in Reaction 2 and Reaction 3. This complex forming reaction with Ru3+ is also employed in forming the linker molecule 32 upon connection of the precursor molecules 41 each other as described later. In the drawings, DMF refers to dimethylformamide. In case of this example, since the reaction molecule 62 has the connecting part 43, Reaction 14 for introducing the connecting part 43 is not necessary.

Figure 9F:
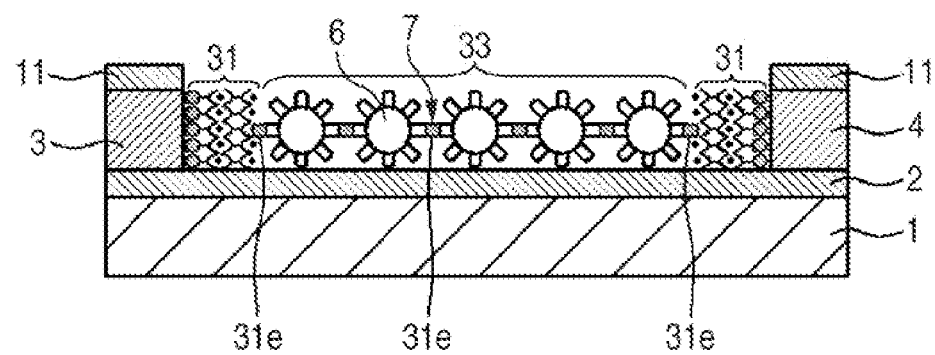

Next, as illustrated in FIG. 9F, by binding the precursor molecule 41 bound to the fine particle 6 to the precursor molecule 41 bound to the adjacent other fine particle 6 to form the linker molecule 32 which connects the fine particles 6 each other, the conductive route 34 for connecting the fine particles 6 in a network state is formed. At that time, a bond between the semiconductor molecule 31 and the precursor molecule 41 can also be formed by the same reaction.

Figure 13B:
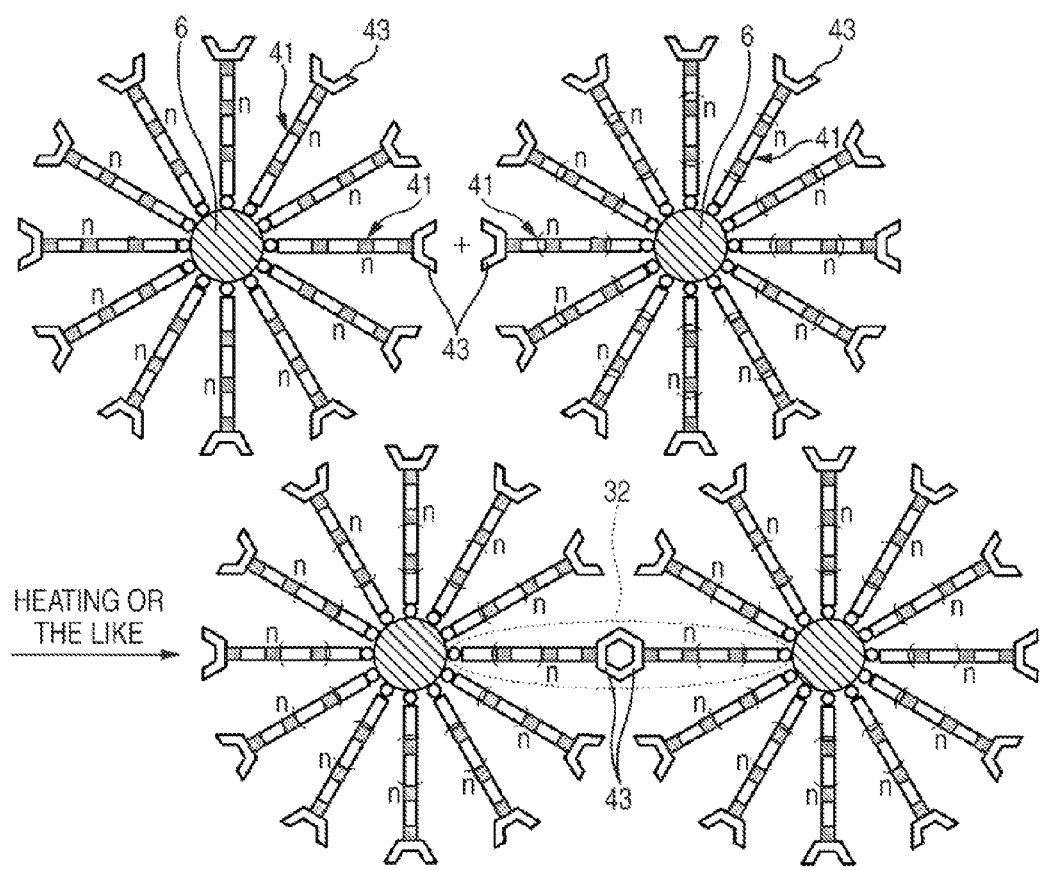
Figure 14A:
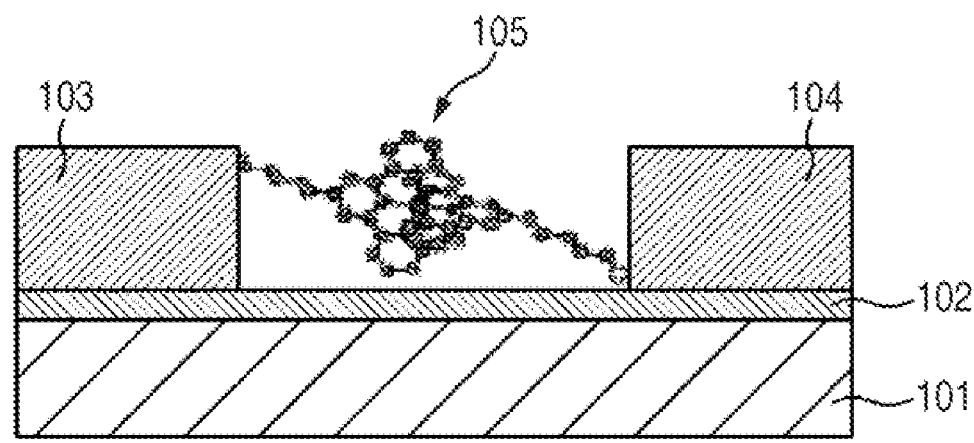
FIG. 14A is a diagrammatic view showing a structure of a molecular transistor as described in Non-Patent Document 1.
Figure 14B:
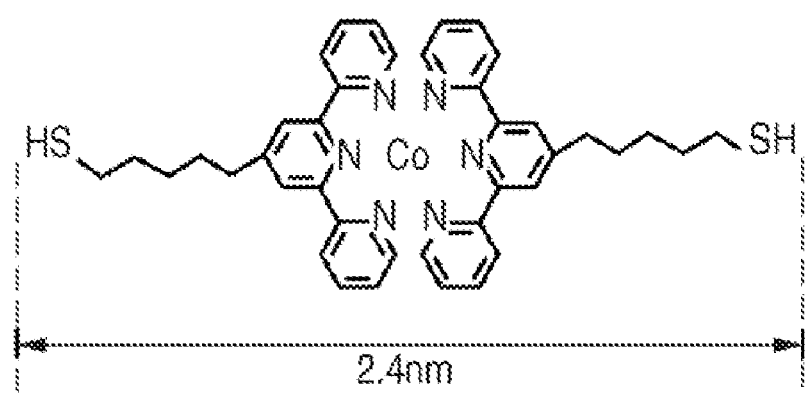
FIG. 14B is a structural formula showing a structure of a semiconductor molecule.

FIGS. 13A to 13B are each an explanatory view showing connecting steps between the precursor molecules 41. For the connecting steps, a method as reported in JP-A-2006-100519 can be employed. For example, in the case where the connecting part 43 is configured of an atomic group which can be a ligand of a metal complex, by dipping the substrate 1 having a layer of the fine particle 6 formed therein in a solution containing a metal ion, as illustrated in FIG. 13A, the metal ion is introduced between the connecting parts 43, and the precursor molecules 41 are connected each other according to a complex forming reaction (see J. Park, A. N. Pasupathy, J. I. Goldsmith, C. Chang, Y. Yaish, J. R. Petta, M. Rinkoski, J. P. Sethna, H. D. Abruna, P. L. McEuen and D. C. Ralph, Nature, 417, 722-725 (2002)).

On the other hand, in the case where it is possible to form a bond upon reaction of the connecting parts 43 each other, as illustrated in FIG. 13B, the reaction is achieved by heating, light irradiation, introduction of a reaction initiator or a catalyst or other methods, thereby connecting the precursor molecules 41 each other. Also, in the case where the connecting part 43 and the adjacent connecting part 43 mutually act due to electrostatic force, Van der Waals force, hydrogen bond, π-π stacking or the like, it is possible to connect the precursors molecules 41 each other due to this action.

Figure 11:
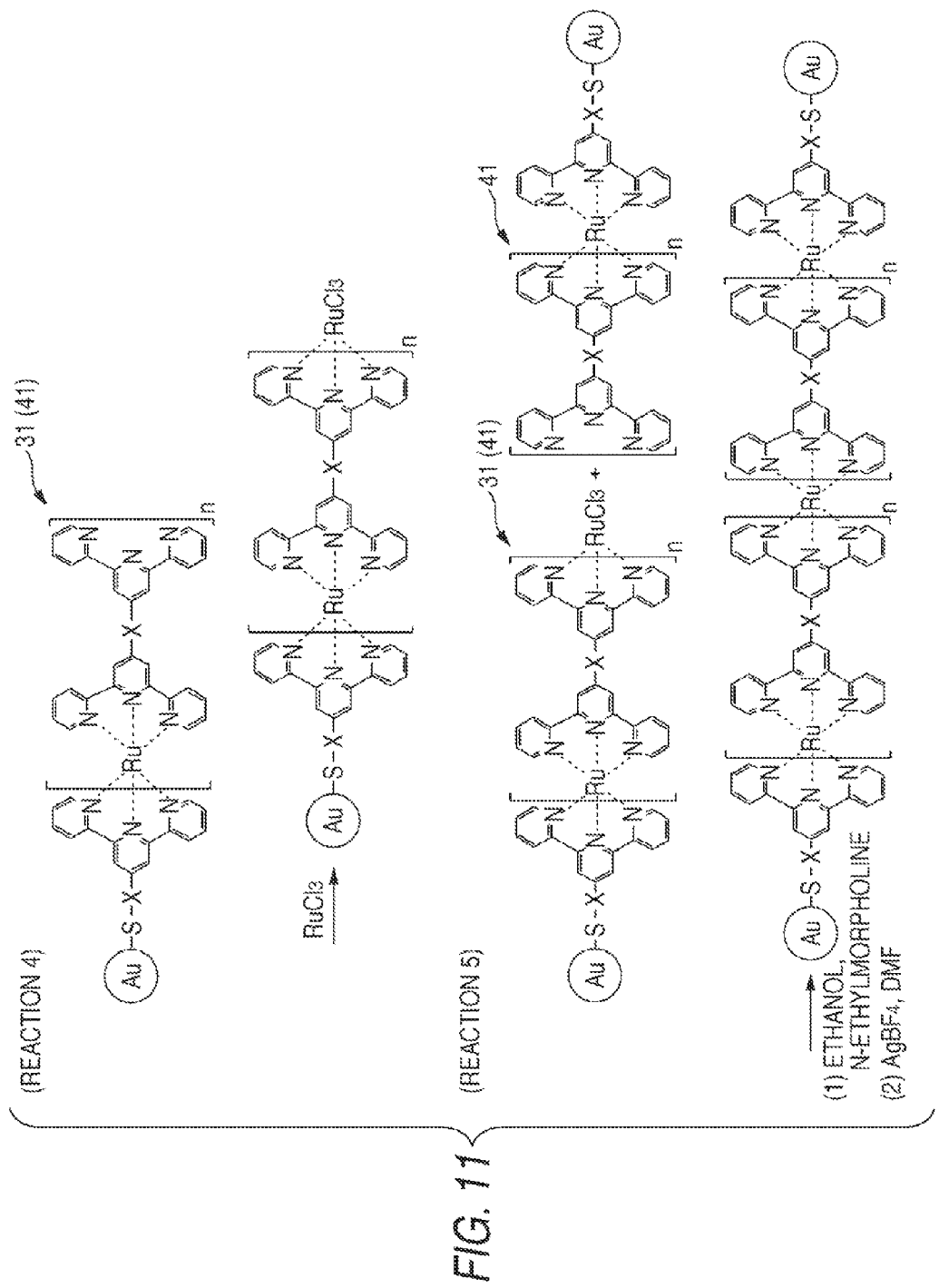
FIG. 11 is an explanatory view showing an example of a connecting reaction according to an embodiment.

FIG. 11 is an explanatory view showing an example in which a connecting reaction between the semiconductor molecule 31 and the precursor molecule 41 or a connecting reaction between the precursor molecules 41 is carried out according to a complex forming reaction. In case of a connecting reaction between the semiconductor molecule 31 and the precursor molecule 41, according to Reaction 4, Ru3+ is first introduced into the ligand part 31c of the semiconductor molecule 31 to form the conductor binding part 31d; and the connecting part 43 of the precursor molecule 41 is then bound to this Ru3+, whereby the both are connected each other. In case of a connecting reaction between the precursor molecules 41, according to Reaction 4, Ru3+ is first introduced into the connecting part 43 of one of the precursor molecules 41; and the connecting part 43 of the other precursor molecule 41 is then bound to this Ru3+, whereby the both are connected each other.

As described previously, by using molecules having the same functional group as the ligand molecules 51 and 52 and the reaction molecules 61 and 62, the connecting reaction between the semiconductor molecule 31 and the precursor molecule 41 and the connecting reaction between the precursors 41 can be simultaneously carried out through the reaction of the same type, and therefore, such is convenient.

While the present application has been described with reference to the embodiments, it should be construed that the present application is not limited thereto at all. Needless to say, modifications can be properly made within the range where the scope of the present application is not deviated. For example, while an example in which the fine particle layer is provided as a single layer has been described in Embodiments 1 to 3, the conductor may be formed by stacking a plural number of fine particle layers.

The semiconductor device and the method for manufacturing the same of the embodiment can be used as an organic semiconductor device which is expected to be used in various electronic circuits in place of the inorganic semiconductor device in the future and a method for manufacturing the same, thereby contributing to the realization thereof.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A semiconductor device comprising:
a first electrode;
a second electrode, the electrodes opposing one another across a gap defined therebetween;
a first semiconductor molecule having a first end and an opposing second end;
a second semiconductor molecule having a first end and an opposing second end, wherein the first end of the first semiconductor molecule is bonded to the first electrode and the first end of the second molecule is bonded to the second electrode; and
a conductor disposed in the gap and electrically connected to the second end of the first semiconductor molecule and the second end of the second semiconductor molecule,
wherein the conductivity between the opposing electrodes is substantially determined by the conductivity of the semiconductor molecules that are electrically connected to the conductor,
wherein the conductor is formed through alternate binding between a fine particle composed of a conductor or a semiconductor and a linker molecule, and
the adjacent fine particles are connected to each other by the linker molecule via a functional group present at both ends thereof,
thereby forming a conductive route of a network type.

2. The semiconductor device according to claim 1, wherein the first electrode is a source electrode;
the second electrode is a drain electrode;
a channel region is formed by semiconductor molecules that are electrically connected to the conductor; and
a gate electrode for subjecting the conductivity of the channel region to electric-field control is provided, thereby configuring a field effect transistor.

3. The semiconductor device according to claim 2, further comprising a gate electrode formed as a gate insulating film, thereby configuring a field effect transistor of a bottom-gate type or top-gate type.

4. The semiconductor device according to claim 1, wherein the fine particle is a fine particle composed of gold, silver, platinum, copper, palladium or iron as the conductor or silicon doped with impurities as the semiconductor.

5. The semiconductor device according to claim 1, wherein the fine particle has a particle size of not more than 10 nm.

6. The semiconductor device according to claim 1, wherein the functional group is a thiol group (—SH), a disulfide group (—S—S—), an amino group (—NH$_2$), a cyano group (—CN) or an isocyano group (—NC).

7. The semiconductor device according to claim 1, wherein the linker molecule is a molecule having a conjugated bond in at least a part of the molecule skeleton thereof.

8. The semiconductor device according to claim 7, wherein the molecular skeleton of the linker molecule contains a phenylene group, a phenylene ethynylene group or a thiophene skeleton.

9. The semiconductor device according to claim 1, wherein the linker molecule has a molecular length of not more than 5 nm.

10. The semiconductor device according to claim 1, wherein the semiconductor molecule is a molecule having a conjugated bond in at least a part of the molecular skeleton thereof.

11. The semiconductor device according to claim 10, wherein the molecular skeleton of the semiconductor molecule contains a phenylene group, a phenylene ethynylene group or a thiophene skeleton.

12. The semiconductor device according to claim 1, wherein in the semiconductor molecules the first end part is an electrode binding part and the second end part is a conductor binding part.

13. The semiconductor device according to claim 12, wherein the electron binding part is composed of a thiol group (—SH), a disulfide group (—S—S—), an amino group (—NH$_2$), a cyano group (—CN) or an isocyano group (—NC).

14. The semiconductor device according to claim 12, wherein the conductor binding part is composed of a thiol group (—SH), a disulfide group (—S—S—), an amino group (—NH$_2$), a cyano group (—CN) or an isocyano group (—NC).

* * * * *